(12) United States Patent
Tan et al.

(10) Patent No.: US 12,308,856 B2
(45) Date of Patent: May 20, 2025

(54) DECODER, DECODING METHOD, MEMORY CONTROLLER, AND MEMORY SYSTEM

(71) Applicant: YANGTZE MEMORY TECHNOLOGIES CO., LTD., Wuhan (CN)

(72) Inventors: Hua Tan, Wuhan (CN); Dili Wang, Wuhan (CN); Xuqing Jia, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

(21) Appl. No.: 18/372,570

(22) Filed: Sep. 25, 2023

(65) Prior Publication Data
US 2025/0047303 A1   Feb. 6, 2025

Related U.S. Application Data

(63) Continuation of application No. PCT/CN2023/111313, filed on Aug. 4, 2023.

(51) Int. Cl.
*H03M 13/11* (2006.01)
*G06F 7/78* (2006.01)
*H03M 13/09* (2006.01)

(52) U.S. Cl.
CPC .......... *H03M 13/1108* (2013.01); *G06F 7/78* (2013.01); *H03M 13/096* (2013.01)

(58) Field of Classification Search
CPC .... H03M 13/1108; H03M 13/096; G06F 7/78
See application file for complete search history.

(56) References Cited

U.S. PATENT DOCUMENTS

| | | | |
|---|---|---|---|
| 2020/0059243 A1* | 2/2020 | Chang | H03M 13/1111 |
| 2023/0044471 A1* | 2/2023 | Kaynak | H03M 13/1111 |
| 2023/0107784 A1* | 4/2023 | Fu | G06F 11/1012 |
| | | | 714/746 |

FOREIGN PATENT DOCUMENTS

| | | |
|---|---|---|
| CN | 101174839 A | 5/2008 |
| CN | 112332858 A | 2/2021 |
| CN | 112350738 A | 2/2021 |
| KR | 20180125298 A | 11/2018 |

OTHER PUBLICATIONS

Gegey. "NR-LDPC decoding: Probabilistic Decoding", https://zhuanlan.zhihu.com/p/461584729?utm_id=0, Feb. 15, 2022 (Feb. 15, 2022), pp. 1-7.

Qu Guowei et al. "Hybrid decoding algorithm for low-density parity check codes", "Journal of System Simulation", Oct. 8, 2018 (Oct. 8, 2018), pp. 4009-4013.

* cited by examiner

*Primary Examiner* — Thien Nguyen
(74) *Attorney, Agent, or Firm* — BAYES PLLC

(57) ABSTRACT

According to one aspect of the present disclosure, a decoder is provided. The decoder may include a cache module. The cache module may be configured to cache soft data related to a codeword to be decoded. The decoder may include a flip-indication module. The flip-indication module may be configured to obtain the soft data from the cache module. The flip-indication module may be configured to, when performing hard-decision decoding on the codeword to be decoded, determine, at least in a first flip iteration and with assistance of the soft data, a number of parity checks not satisfied by bits in the codeword to be decoded.

16 Claims, 17 Drawing Sheets

DECODER, DECODING METHOD, MEMORY CONTROLLER, AND MEMORY SYSTEM

CROSS-REFERENCE TO RELATED APPLICATIONS

The present application is a continuation of International Application No. PCT/CN2023/111313, filed on Aug. 4, 2023, the content of which is incorporated herein by reference in its entirety.

TECHNICAL FIELD

The present disclosure relates to the field of memory technologies, and in particular to a decoder, a decoding method, a memory controller, and a memory system.

BACKGROUND

With the development of storage technology, 3D Not-And (NAND) flash memory (e.g., Flash) has evolved from Single-Level Cells (SLC) that can store 1 bit of information and Double-Level Cells (DLC) that can store 2 bits of information to Triple-Level Cells (TLC) that can store 3 bits of information, and even Quadruple-Level Cells (QLC) that can store 4 bits of information. The number of stacked layers is also increasing. For memory devices with more and more layers and memory bits, low density parity check (LDPC) is usually employed for error correction when reading data in order to enhance the reliability of the data stored in the memory device.

SUMMARY

According to one aspect of the present disclosure, a decoder is provided. The decoder may include a cache module. The cache module may be configured to cache soft data related to a codeword to be decoded. The decoder may include a flip-indication module. The flip-indication module may be configured to obtain the soft data from the cache module. The flip-indication module may be configured to, when performing hard-decision decoding on the codeword to be decoded, determine, at least in a first flip iteration and with assistance of the soft data, a number of parity checks not satisfied by bits in the codeword to be decoded.

In some implementations, the flip-indication module may be further configured to determine an initial error bit indication vector corresponding to the codeword to be decoded. In some implementations, the flip-indication module may be further configured to determine, with assistance of the soft data in combination with the initial error bit indication vector, the number of parity checks not satisfied by the bits in the codeword to be decoded.

In some implementations, the decoder may further include a check-node module. In some implementations, the decoder may further include a variable-node module. In some implementations, the variable-node module may be configured to receive hard-read data and generate the codeword to be decoded according to the hard-read data. In some implementations, the variable-node module may be configured to send the codeword to be decoded to the check-node module. In some implementations, the variable-node module may be configured to send the codeword to be decoded and the hard-read data to the flip-indication module. In some implementations, the variable-node module and the check-node module may be connected to form a variable-check connection network according to a check matrix. In some implementations, the check-node module may be configured to receive the codeword to be decoded. In some implementations, the check-node module may be configured to determine a checksum vector according to the codeword to be decoded and the check matrix. In some implementations, the check-node module may be configured to send the checksum vector to the flip-indication module. In some implementations, the flip-indication module may be further configured to receive the codeword to be decoded and the hard-read data sent by the variable-node module. In some implementations, the flip-indication module may be further configured to receive the checksum vector sent by the check-node module. In some implementations, the flip-indication module may be further configured to obtain the check matrix and the soft data. In some implementations, the flip-indication module may be further configured to determine the initial error bit indication vector corresponding to the codeword to be decoded according to the hard-read data, the codeword to be decoded, the checksum vector, and the check matrix.

In some implementations, the flip-indication module may be further configured to determine a soft data vector corresponding to the soft data. In some implementations, the flip-indication module may be further configured to perform a sum operation on the soft data vector and the initial error bit indication vector to obtain a target error bit indication vector. In some implementations, the flip-indication module may be further configured to determine a number of parity checks not satisfied by each bit in the codeword to be decoded according to the target error bit indication vector. In some implementations, each element in the target error bit indication vector may correspond to the number of parity checks not satisfied by one bit.

In some implementations, the flip-indication module may be further configured to perform a sum operation on the hard-read data and the codeword to be decoded and then perform a modulo operation on the sum operation to obtain a first bit vector. In some implementations, the flip-indication module may be further configured to multiply transposition of the checksum vector by the check matrix to obtain a second bit vector. In some implementations, the flip-indication module may be further configured to perform a sum operation on the first bit vector and the second bit vector to obtain the initial error bit indication vector.

In some implementations, the flip-indication module may be further configured to generate a flip-indication vector according to the number of parity checks not satisfied and a flipping criterion. In some implementations, the flip-indication vector may include determined bits that need to be flipped in the codeword to be decoded. In some implementations, the variable-node module may be further configured to receive the flip-indication vector and flip the bits that need to be flipped in the codeword to be decoded according to the flip-indication vector.

In some implementations, the flipping criterion may include flipping the bits in the codeword to be decoded for which the number of parity checks not satisfied is largest. In some implementations, the flipping criterion may include flipping the bits in the codeword to be decoded for which the number of parity checks not satisfied is greater than or equal to a preset threshold.

In some implementations, the decoder may further include a counting module. In some implementations, the counting module may be configured to count a number of iterations of the hard-decision decoding performed on the codeword to be decoded. In some implementations, the decoder may include a termination-decision module. In some implementations, the termination-decision module may be configured to determine whether the number of iterations reaches a maximum number of iterations and determine whether the checksum vector is a zero vector. In some implementations, the termination-decision module may be configured to, when the number of iterations reaches the maximum number of iterations and the checksum vector is a non-zero vector, output a first stop decoding signal. The first stop decoding signal may indicate that the hard-decision decoding of the codeword to be decoded fails.

In some implementations, the decoder may further include a rearrangement module. In some implementations, the termination-decision module may be further configured to, when it is determined that the checksum vector is a zero vector, output a second stop decoding signal. In some implementations, the rearrangement module may be configured to, in response to the second stop decoding signal, perform rearrangement processing on the codeword to be decoded. In some implementations, the rearrangement module may be configured to output codeword to be decoded in a correct order.

In some implementations, the termination-decision module may be further configured to, when the checksum vector is not a zero vector and the number of iterations has not reached the maximum number of iterations, output a continue-coding signal. In some implementations, the continue-coding signal may be output to instruct the variable-node module, the check-node module, and the flip-indication module to continue to perform a hard-decision decoding operation on the codeword to be decoded.

According to another aspect of the present disclosure, a method of decoding is provided. The method may include obtaining soft data corresponding to a codeword to be decoded. When performing hard-decision decoding on the codeword to be decoded, the method may include determining, at least in a first flip iteration and with assistance of the soft data, a number of parity checks not satisfied by bits in the codeword to be decoded.

In some implementations, the determining, with assistance of the soft data, the number of parity checks not satisfied by the bits in the codeword to be decoded may include determining an initial error bit indication vector corresponding to the codeword to be decoded. In some implementations, the determining, with assistance of the soft data, the number of parity checks not satisfied by the bits in the codeword to be decoded may include determining, with assistance of the soft data in combination with the initial error bit indication vector, the number of parity checks not satisfied by the bits in the codeword to be decoded.

In some implementations, the determining, with assistance of the soft data in combination with the initial error bit indication vector, the number of parity checks not satisfied by the bits in the codeword to be decoded may include determining a soft data vector corresponding to the soft data. In some implementations, the determining, with assistance of the soft data in combination with the initial error bit indication vector, the number of parity checks not satisfied by the bits in the codeword to be decoded may include performing a sum operation on the soft data vector and the initial error bit indication vector to obtain a target error bit indication vector. In some implementations, the determining, with assistance of the soft data in combination with the initial error bit indication vector, the number of parity checks not satisfied by the bits in the codeword to be decoded may include determining a number of parity checks not satisfied by each bit in the codeword to be decoded according to the target error bit indication vector. In some implementations, each element in the target error bit indication vector may correspond to the number of parity checks not satisfied by one bit.

In some implementations, the determining the initial error bit indication vector corresponding to the codeword to be decoded may include receiving hard-read data and generating the codeword to be decoded according to the hard-read data. In some implementations, the determining the initial error bit indication vector corresponding to the codeword to be decoded may include determining a checksum vector according to the codeword to be decoded and a check matrix. In some implementations, the determining the initial error bit indication vector corresponding to the codeword to be decoded may include determining the initial error bit indication vector corresponding to the codeword to be decoded according to the hard-read data, the codeword to be decoded, the checksum vector, and the check matrix.

In some implementations, the determining the initial error bit indication vector corresponding to the codeword to be decoded according to the hard-read data, the codeword to be decoded, the checksum vector, and the check matrix may include performing a sum operation on the hard-read data and the codeword to be decoded and then perform a modulo operation on the sum operation to obtain a first bit vector. In some implementations, the determining the initial error bit indication vector corresponding to the codeword to be decoded according to the hard-read data, the codeword to be decoded, the checksum vector, and the check matrix may include multiplying transposition of the checksum vector by the check matrix to obtain a second bit vector. In some implementations, the determining the initial error bit indication vector corresponding to the codeword to be decoded according to the hard-read data, the codeword to be decoded, the checksum vector, and the check matrix may include performing a sum operation on the first bit vector and the second bit vector to obtain the initial error bit indication vector.

In some implementations, the method may include generating a flip-indication vector according to the number of parity checks not satisfied and a flipping criterion. In some implementations, the flip-indication vector may include determined bits that need to be flipped in the codeword to be decoded. In some implementations, the method may include flipping the bits that need to be flipped in the codeword to be decoded according to the flip-indication vector.

In some implementations, the flipping criterion may include flipping the bits in the codeword to be decoded for which the number of parity checks not satisfied is largest. In some implementations, the flipping criterion may include flipping the bits in the codeword to be decoded for which the number of parity checks not satisfied is greater than or equal to a preset threshold.

In some implementations, the method may include counting a number of iterations of the hard-decision decoding performed on the codeword to be decoded. In some implementations, the method may include determining whether the number of iterations reaches a maximum number of iterations and determining whether the checksum vector is a zero vector. When the number of iterations reaches the maximum number of iterations and the checksum vector is a non-zero vector, the method may include outputting a first stop decoding signal. In some implementations, the first stop decoding signal may indicate that the hard-decision decoding of the codeword to be decoded fails.

In some implementations, the method may include determining whether the checksum vector is a zero vector. In some implementations, when it is determined that the checksum vector is a zero vector, the method may include outputting a second stop decoding signal. In some implementations, in response to the second stop decoding signal, the method may include performing rearrangement processing on the codeword to be decoded. In some implementations, the method may include outputting codeword to be decoded in a correct order.

In some implementations, when the checksum vector is not a zero vector and the number of iterations has not reached the maximum number of iterations, the method may include output a continue-coding signal. In some implementations, the continue-coding signal is associated with an instruction to perform a hard-decision decoding operation on the codeword to be decoded.

According to a further aspect of the present disclosure, a memory controller is provided. The memory controller may include a processor. The processor may be configured to read soft data corresponding to a codeword to be decoded from a memory device. The memory controller may include a decoder. The decoder may be configured to cache the soft data. When performing hard-decision decoding on the codeword to be decoded, the decoder may be configured to determine, at least in a first flip iteration and with assistance of the soft data, a number of parity checks not satisfied by bits in the codeword to be decoded.

According to yet another aspect of the present disclosure, a memory system is provided. The memory system may include a memory device configured to store data. The memory system may include a memory controller coupled to the memory device. The memory controller may include a processor. The processor may be configured to read soft data corresponding to a codeword to be decoded from the memory device. The memory controller may include a decoder. The decoder may be configured to cache the soft data. When performing hard-decision decoding on the codeword to be decoded, the decoder may be configured to determine, at least in a first flip iteration and with assistance of the soft data, a number of parity checks not satisfied by bits in the codeword to be decoded.

In some implementations, the processor may be further configured to read hard-read data from the memory device. In some implementations, the processor may be further configured to send the hard-read data to the decoder. In some implementations, the decoder may be further configured to receive the hard-read data and generate the codeword to be decoded according to the hard-read data.

In some implementations, the decoder may include a check-node module. In some implementations, the decoder may include a cache module. In some implementations, the cache module may be configured to cache the soft data read by the processor. In some implementations, the decoder may include a variable-node module. In some implementations, the variable-node module may be configured to receive the hard-read data read by the processor and generate the codeword to be decoded according to the hard-read data. In some implementations, the variable-node module may be configured to send the codeword to be decoded to a check-node module. In some implementations, the check-node module may be configured to receive the codeword to be decoded sent by the variable-node module. In some implementations, the check-node module may be configured to determine a checksum vector according to the codeword to be decoded and a check matrix. In some implementations, the check-node module may be configured to send the checksum vector to a flip-indication module. In some implementations, the flip-indication module may be configured to receive the hard-read data and the codeword to be decoded sent by the variable-node module. In some implementations, the flip-indication module may be configured to receive the checksum vector sent by the check-node module. In some implementations, the flip-indication module may be configured to obtain the check matrix and the soft data. In some implementations, the flip-indication module may be configured to determine an initial error bit indication vector corresponding to the codeword to be decoded according to the hard-read data, the codeword to be decoded, the checksum vector, and the check matrix. In some implementations, the flip-indication module may be configured to determine, with assistance of the soft data in combination with the initial error bit indication vector, a number of parity checks not satisfied by bits in the codeword to be decoded.

Examples of the present disclosure provide a decoder, a decoding method, a memory controller, and a memory system. The decoder may include a cache module and a flip-indication module. The cache module may be configured to cache soft data related to a codeword to be decoded. The flip-indication module may be configured to obtain the soft data from the cache module; and when performing hard-decision decoding on the codeword to be decoded, the flip-indication module determine, at least in a first flip iteration and with assistance of the soft data, a number of parity checks not satisfied by bits in the codeword to be decoded. The decoder provided by the example of the present disclosure caches the soft data related to the codeword to be decoded through the included buffer module; and then, when performing hard-decision decoding on the codeword to be decoded, the flip-indication module may determine, with assistance of the soft data, a number of parity checks not satisfied by bits in the codeword to be decoded in one or more iterations. In this way, the soft data is used to assist the flipping decision of the hard-decision decoding to enable high throughput and low power consumption of the hard-decision decoding, thereby improving the error-correction capability of hard-decision decoding.

BRIEF DESCRIPTION OF THE DRAWINGS

In the drawings, which are not necessarily to scale, like reference numerals may describe similar components in the different views. The same number with a different letter suffix may indicate different instances of similar components. The drawings generally illustrate various examples discussed in this document, by way of example and not limitation.

DETAILED DESCRIPTION

Figure 1:
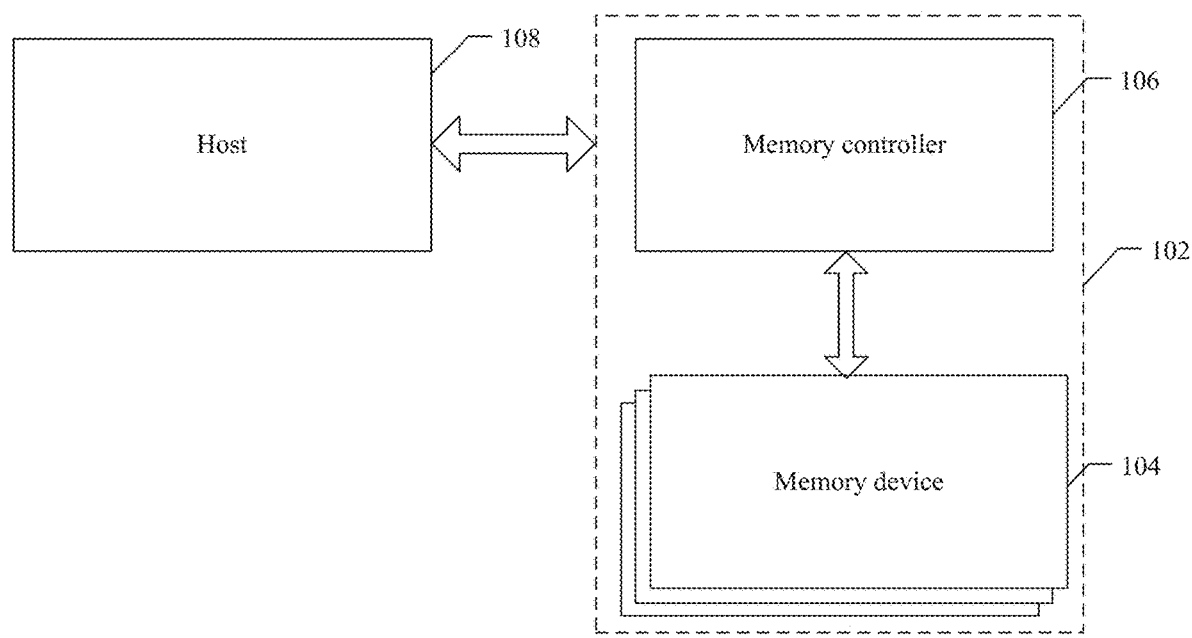
FIG. 1 is a schematic diagram of an example system having a memory system, according to an example of the present disclosure.

Various examples of the present disclosure are described in more detail below with reference to the accompanying drawings. Other examples that are variations of any disclosed example can be formed by differently configuring or arranging elements and features of the examples of the present disclosure. Therefore, examples of the present disclosure are not limited to the examples set forth herein. Rather, the described examples are provided so that the disclosed examples will be thorough and complete, and will fully convey the scope of the disclosed examples to those skilled in the art to which the examples of the present disclosure pertain. It should be noted that references to "an example," "another example" and the like do not necessarily mean only one example, and that different references to any such phrase are not necessarily directed to the same example. It should be understood that although the terms such as "first," "second," "third," etc. may be used herein to identify various elements, these elements should not be limited by these terms. These terms are used to distinguish one element from another element having the same or similar name. Therefore, a first element in one example may also be referred to as a second or third element in another example without departing from the spirit and scope of the examples of the present disclosure.

The drawings are not necessarily to scale, and in some instances the scale may have been exaggerated to clearly illustrate features of the examples. When an element is referred to as being connected or coupled to another element, it should be understood that the former may be directly connected or coupled to the latter or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular examples only and is not intended to be limiting of the present disclosure. As used herein, singular forms are intended to include plural forms unless the context clearly dictates otherwise. Unless otherwise stated or clearly understood as a singular form from the context, at least one of the articles "a" or "an" used in the examples of the present disclosure and the appended claims shall be collectively interpreted as meaning "one or more". It should be further understood that the terms "comprise", "comprising", "include", and "including" used in the examples of the present disclosure specify the presence of stated elements and do not exclude the presence or addition of one or more other elements. The term "at least one of" used in the examples of the present disclosure includes any and all combinations of one or more of the associated listed items. Unless otherwise defined, all terms including technical and scientific terms used in the examples of the present disclosure have the same meanings as commonly understood by one of ordinary skill in the art to which the present disclosure belongs in view of the examples of the present disclosure. It should be further understood that, unless clearly defined by the examples of the present disclosure, terms such as those defined in commonly used dictionaries should be interpreted as having meanings consistent with their meanings in the context of the examples of the present disclosure and related technologies, and should not be interpreted in an ideal or overly formalized way.

In the following description, numerous specific details are set forth in order to provide a thorough understanding of the disclosure, and the disclosure may be practiced without some or all of these specific details. In other instances, at least one of well-known processing structures or processes have not been described in detail so as not to unnecessarily obscure the present disclosure. It should also be understood that in some cases, unless stated otherwise, a feature or element described with respect to one example may be used alone or in combination with other features or elements of another example, unless otherwise specified, as would be apparent to a person skilled in the relevant art. Hereinafter, various examples of the present disclosure are described in detail with reference to the accompanying drawings. The following description focuses on details to facilitate understanding of examples of the present disclosure. Well-known technical details may be omitted so as not to obscure the features and aspects of the examples of the present disclosure.

To understand the characteristics and technical content of the examples of the present disclosure in more detail, the examples of the present disclosure are described in detail below in conjunction with the accompanying drawings. The appended drawings are only for reference and description, and are not intended to limit the examples of the present disclosure.

A memory device is memory equipment used to preserve information in modern information technology. As a non-volatile memory device, 3D NAND-type memory devices have become a mainstream product in the storage market due to their high storage density, controllable production cost, suitable programming, erasing speed, and retention characteristics. With the increase in the number of memory bits of the memory cell and the increase in the number of stacked layers, the types of errors that occur during the read operation of the memory device become more and more complex. In this case, when LDPC hard-decision decoding in the decoder is used to code the codeword (data read from the memory device), the decoding time increases and the error-correction capability becomes weaker, which negatively impacts the reading rate.

Based on one or more of the above problems, an example of the present disclosure provides a decoder that utilizes soft data to assist the flip decision of hard-decision decoding, and realizes the characteristics of high throughput and low-power consumption of hard-decision decoding, thereby improving the error-correction capability of hard-decision decoding.

The examples of the present disclosure will be further described in detail below in conjunction with the accompanying drawings and specific examples.

FIG. 1 is a schematic diagram of an example system having a memory system according to an example of the present disclosure. In FIG. 1, the system 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having a memory system therein. As shown in FIG. 1, system 100 can include a host 108 and a memory system 102. The host 108 may include a processor, such as a Central Processing Unit (CPU) or a System-on-Chip (SoC). The SoC may be, for example, an Application Processor (AP). The host 108 further includes at least one operating system (OS) that can generally manage and control the functions and operations performed in the host 108. The OS may enable interoperability between a host 108 coupled to the memory system 102 and users who need and use the memory system 102. The OS may support functions and operations corresponding to user's requests. By way of example but not limitation, according to whether the type of the host 108 is a removable host, the OS may be classified into a general-purpose operating system and a mobile operating system. The general-purpose operating system can include personal operating systems, which may be an operating system that is used to support services for general purpose including Windows and Chrome, and enterprise operating systems, which may be an operating system specially designed to ensure and support high performance including Windows Server, Linux, Unix, etc. The mobile operating system may refer to an operating system for mobility services or functions (e.g., power saving function). Generally speaking, the mobile operating system may be an operating system such as Android, IOS, and Windows Mobile. In some examples, the host 108 may include multiple OSs. Correspondingly, the host 108 may run multiple operating systems related to the memory system 102. In other examples, the host 108 converts the user's request into one or more commands, and transmits the one or more commands to the memory system 102, so that the memory system 102 executes operations related to the one or more commands.

The memory system 102 is capable of operating or performing specific functions or performing various internal operations in response to a request from the host 108. In some examples, the memory system 102 is capable of storing data accessed by the host 108. The memory system 102 can function as a primary memory system or a secondary memory system for the host 108. The memory system 102 and the host 108 can be electrically coupled and communicate according to corresponding protocols. The memory system 102 can be implemented and packaged into different types of end electronic products, including, but not limited to, Solid State Drive (SSD), Multimedia Card (MMC), Embedded MMC (eMMC), Reduced Size MMC (RSMMC), Micro MMC, Secure Digital (SD) cards, Mini SD, Micro SD, Universal Serial Bus (USB) storage devices, Universal Flash Memory (UFS) devices, Compact Flash (CF) cards, Smart Media (SM) cards and memory sticks, and so on.

In some examples, the memory system 102 may also be configured as part of, for example, computers, ultra-mobile PCs (UMPCs), workstations, netbooks, personal digital assistants (PDAs), portable computers, web tablets, tablet computers, wireless phones, mobile phones, smart phones, e-books, portable multimedia players (PMPs), portable game consoles, navigation systems, black boxes, digital cameras, digital multimedia broadcasting (DMB) players, three-dimensional (3D) televisions, smart TVs, digital audio recorders, digital audio players, digital picture recorders, digital picture players, digital video recorders, digital video players, storage devices configured with a data center, devices capable of transmitting and receiving information in a wireless environment, one of various electronic devices configured with a home network, one of various electronic devices configured with a computer network, one of various electronic devices configured with telematics network, radio frequency identification (RFID) devices, or one of the various components configured with a computing system.

Figure 2A:
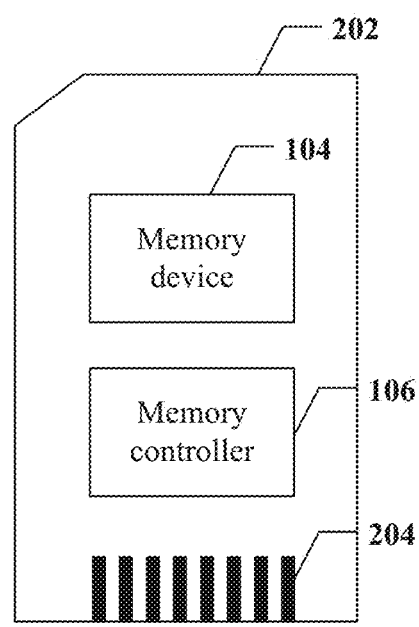
FIG. 2a is a schematic diagram of an example memory card having a memory system, according to an example of the present disclosure.
Figure 2B:
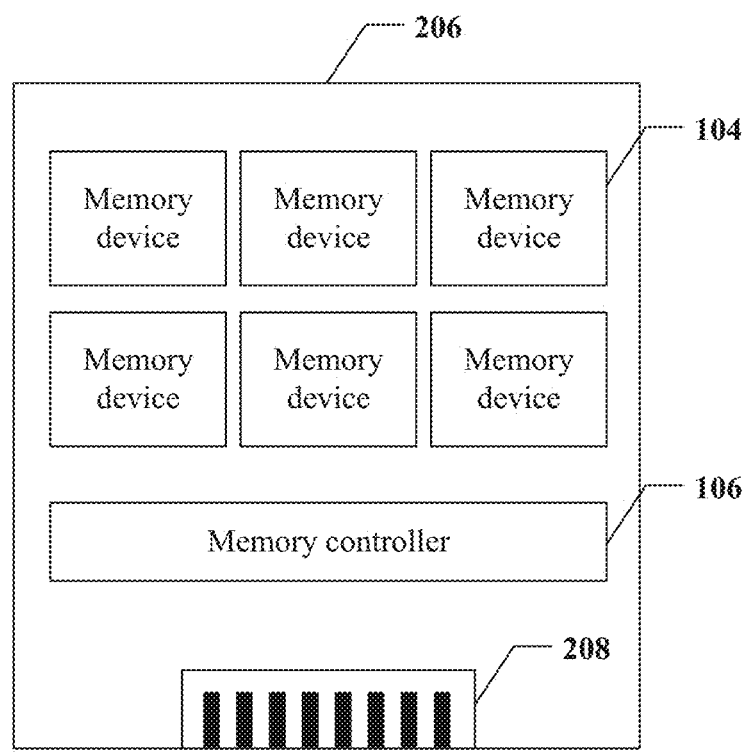
FIG. 2b is a schematic diagram of an example solid state drive having a memory system, according to an example of the present disclosure.

Referring back to FIG. 1, the memory system 102 may include one or more memory devices 104 and a memory controller 106. The memory controller 106 can respond to the request of the host 108, and then control the memory device 104. For example, the memory controller 106 can read data from the memory device 104, and transmit the read data to the host 108. Furthermore, the memory controller 106 can receive data to be stored from the host 108, and store the data to be stored into the memory device 104. That is, the memory controller 106 is capable of controlling write (or program) operations, read operations, erase operations, background operations, and the like of the memory device 104. Furthermore, the memory system 102 can be implemented and packaged into different types of end electronic products. In one example as shown in FIG. 2 a, memory controller 106 and a single memory device 104 may be integrated into memory card 202. Memory card 202 can include a PC card (PCMCIA, personal computer memory card international association), a CF card, a smart media (SM) card, a memory stick, a multimedia card (MMC, RSMMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2b, memory controller 206 and multiple memory devices 104 may be integrated into an SSD 206. SSD 206 can further include an SSD connector 208 coupling SSD 206 with a host (e.g., host 108 in FIG. 1). In some examples, at least one of the storage capacity or the operation speed of SSD 206 is greater than those of memory card 202.

Figure 3:
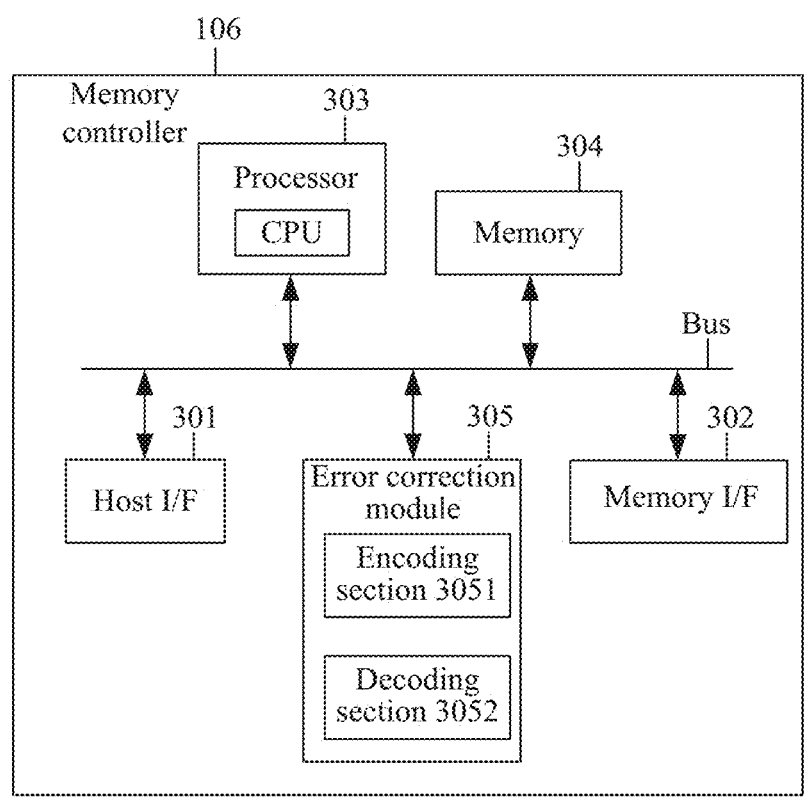
FIG. 3 is a schematic structural diagram of a memory controller, according to an example of the present disclosure.

As shown in FIG. 3, the memory controller 106 may include a host I/F (or front-end interface) 301, a memory I/F (or back-end interface) 302, a processor 303, and a memory 304. The above-mentioned components 301, 302, 303, and 304 of the memory controller 106 can share transmission signals inside the memory controller 106 through an internal bus. In some examples, the host I/F 301 can interface the host 108 with the memory system 102 in response to the protocol of host 108, and the host I/F 301 exchanges transfer commands and data operations between the host 108 and the memory system 102. The host I/F 301 can process commands and data sent by the host 108, and can include at least one of the followings: Universal Serial Bus (USB), Multimedia Card (MMC), Peripheral Component Interconnect Express (PCI-e or PCIe), Small Computer System Interface (SCSI), Serial SCSI (SAS), Serial Advanced Technology Attachment (SATA), Parallel Advanced Technology Attachment (PATA), Small Computer System Interface (SCSI), Enhanced Small Disk Interface (ESDI), and Electronics Integration drive (IDE). In some examples, the host I/F 301 is a component of the memory system 102 used to exchange data with the host 108 and may be implemented by firmware called a host interface layer (HIL).

The memory I/F 302 may be an interface for commands and data transferred between memory controller 106 and memory device 104, allowing memory controller 106 to control the memory device 104 in response to requests communicated from the host 108. The memory I/F 302 may generate control signals for controlling the memory device 104. In some examples, if the memory device 104 is a NAND flash memory, the memory I/F 302 can write data into the memory device 104 or read data from the memory device 104 under the control of the processor 303. The memory I/F 302 can handle commands and data between the memory controller 106 and the memory device 104, for example, the operation of the NAND flash interface, especially the operation between the memory controller 106 and the memory device 104. According to an example, the memory I/F 302 may be implemented as a component for exchanging data with the memory device 104 by firmware called a Flash Interface Layer (FIL).

The processor 303 may be implemented by a microprocessor or a central processing unit (CPU). The memory system 102 may include one or more processors 303. The processor 303 can control the overall operation of the memory system 102. By way of example and not limitation, the processor 303 may control a program operation or a read operation of the memory device 104 in response to a write request or a read request from the host 108. According to an example, the processor 303 may use or run firmware to control the overall operation of the memory system 102. In this disclosure, firmware may be referred to as a flash translation layer (FTL). The FTL may operate as an interface between the host 108 and the memory device 104. The host 108 can transmit requests related to write operations and read operations to the memory device 104 through the FTL. For example, the memory controller 106 uses the processor 303 when performing an operation requested from the host 108 in the memory device 104. The processor 303 coupled to memory device 104 may process instructions or commands related to commands from the host 108. The memory controller 106 can perform a foreground operation such as a command operation corresponding to a command input from the host 108, for example, a program operation corresponding to a write command, a read operation corresponding to a read command, and an erase/discard operation corresponding to an erase/discard command, and a parameter setting operation corresponding to a set parameter command or a set feature command with a set command.

As another example, the memory controller 106 may perform background operations on the memory device 104 by the processor 303. By way of example and not limitation, the background operations may include garbage collection (GC) operations, wear leveling (WL) operations, map clear operations, and bad block management operations that check or search for bad blocks. The garbage collection operations may include operations to copy and process data stored in a certain memory block in the memory device 104 to another memory block. The wear leveling operations may include operations to swap and process stored data between memory blocks of the memory device 104. The map clear operations may include operations to store map data stored in the memory controller 106 into memory blocks of the memory device 104. The bad block management operations may include operations to check and process bad blocks in memory blocks of the memory device 104. The memory controller 106 may respond to operations to access memory blocks of the memory device 104. The operations to access the memory blocks of the memory device 104 may include foreground or background operations performed on the memory blocks of the memory device 104.

The memory 304 may be a working memory of the memory controller 106 and is configured to store data used to drive the memory controller 106. More specifically, when the memory controller 106 controls the memory device 104 in response to a request from the host 108, the memory 304 can store firmware driven by the processor 303 and data (e.g., metadata) used to drive the firmware. The memory 304 may also be a buffer memory of the memory controller 106 and is configured to temporarily store the write data transferred from the host 108 to the memory device 104 and the read data transferred from the memory device 104 to the host 108. The memory 304 may include program memory, data memory, write buffer/cache, read buffer/cache, data buffer/cache, and map buffer/cache for storing the write data and the read data. The memory 304 may be implemented using volatile memory. The memory 304 may be implemented using static random access memory (SRAM), dynamic random access memory (DRAM), or both.

Although FIG. 3 shows the memory 304 being included in the memory controller 106, the present disclosure is limited thereto. In an example, the memory 304 may be external to the memory controller 106, and the memory controller 106 may input and output data to and from memory 304 via a separate memory interface (not shown).

An error correction module 305 (e.g., an error correction code (ECC) module) is provided with an encoding section 3051 and a decoding section 3052. The encoding section 3051 can perform an encoding operation such as LDPC on data to be programmed into the semiconductor memory device 104, and output data including an additional parity check bit. The parity check bit may be stored in the semiconductor memory device 104. The decoding section 3052 can perform error correction decoding on the data read from the semiconductor memory device 104, determine whether the error correction decoding is successful, output an instruction signal based on the determination result, and use the parity check bit generated by the LDPC encoding operation to correct error bits of data.

Here, although FIG. 3 shows that the error correction module 305 is included in the memory controller 106, the present disclosure is not limited thereto. In an example, the error correction module 305 may be external to the memory controller 106, and the memory controller 106 may be in data communication with the error correction module 305 via a separate interface (not shown).

Referring back to FIG. 1, the memory device 104 may include non-volatile memory that retains data stored therein even when power is not supplied. The memory device 104 may further include volatile storage memory. The device 104 can store data provided from the host 108 through a write operation. The memory device 104 can also provide the stored data to the host 108 through a read operation. In examples of the present disclosure, the memory device 104 may include any memory disclosed, for example, volatile memory devices such as dynamic random access memory (DRAM) and static RAM (SRAM), or non-volatile memory devices such as Read-Only Memory (ROM), Mask ROM (MROM), Programmable ROM (PROM), Erasable Programmable ROM (EPROM), Electrically Erasable Programmable ROM (EEPROM), Ferroelectric RAM (FRAM), Phase Change RAM (PRAM), Magnetic Resistive RAM (MRAM), Resistive RAM (RRAM or ReRAM), and flash memory (such as three-dimensional NAND flash memory).

Figure 4:
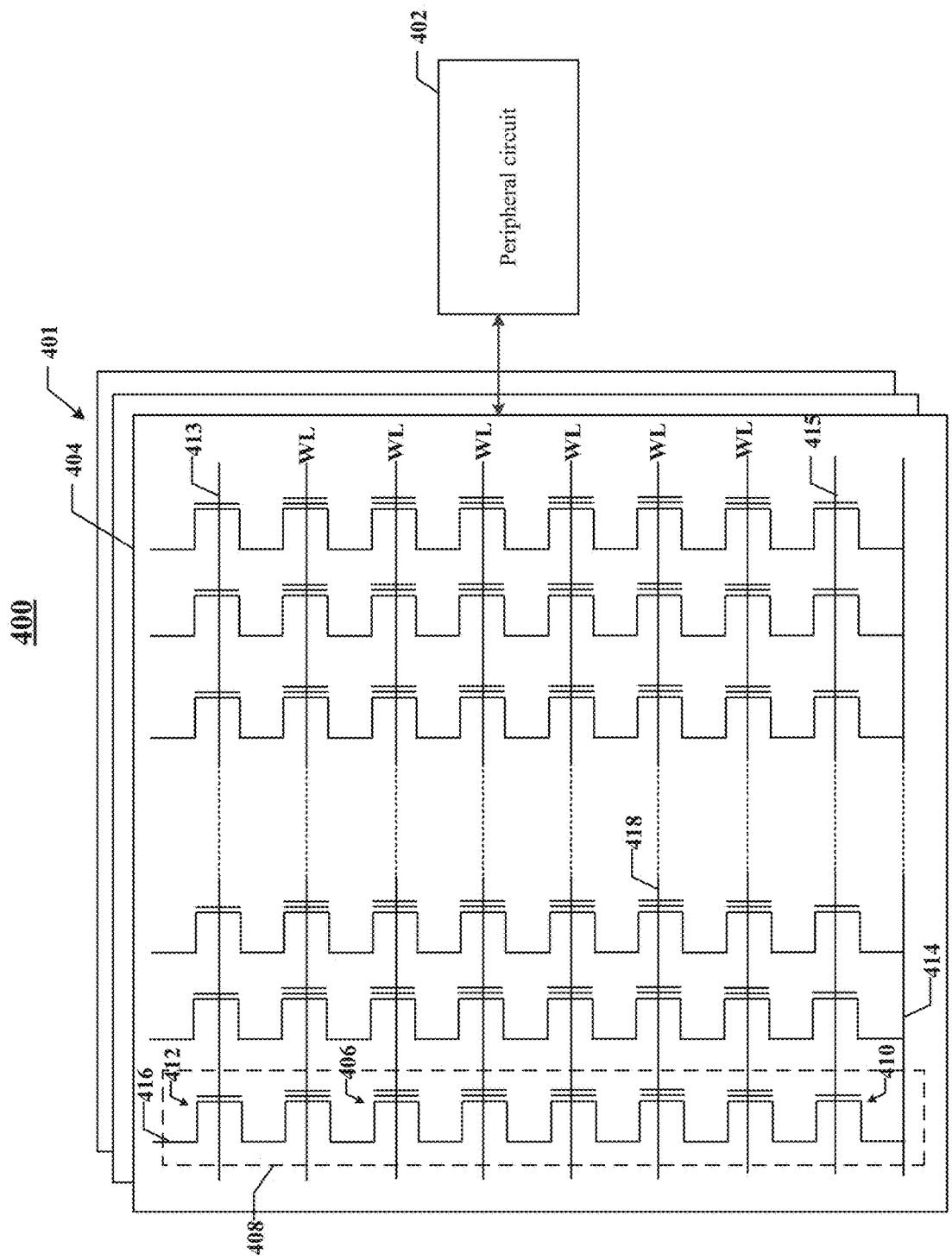
FIG. 4 is a schematic diagram of an example memory device including peripheral circuits, according to an example of the present disclosure.

The memory device is illustrated by taking a three-dimensional NAND flash memory as an example. Referring to FIG. 4, a schematic circuit diagram of an example memory device 400 including peripheral circuits according to some aspects of the present disclosure is shown. The memory device 400 may be an example of the memory device 104 in FIG. 1. The memory device 400 may include a memory array 401 and a peripheral circuit 402 coupled to the memory array 401. The memory array 401 is illustrated by taking a three-dimensional NAND type memory array as an example. The memory cells 406 are provided in the form of an array of NAND-memory strings 408 each extending vertically above a substrate (not shown). In some examples, each NAND-memory string 408 includes a plurality of memory cells 406 coupled in series and stacked vertically. Each memory cell 406 can hold a continuous, analog value, such as an electrical voltage or charge, that depends on the number of electrons trapped within a region of memory cell 406. Each memory cell 406 can be either a floating gate type of memory cell including a floating-gate transistor or a charge-trap type of memory cell including a charge-trap transistor.

In some examples, each memory cell 406 is a single-level cell (SLC) that has two possible memory states and thus, can store one bit of data. For example, the first memory state "0" can correspond to a first range of voltages, and the second memory state "1" can correspond to a second range of voltages. In some examples, each memory cell 406 is a multi-level cell (MLC) that is capable of storing more than a single bit of data in more than four memory states. For example, the MLC can store two bits-per-cell, three bits-per-cell (also known as trinary-level cell (TLC)), four bits-per-cell (also known as a quad-level cell (QLC)), or five bits-per-cell (also known as a penta-level cell (PLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 4, each NAND-memory string 408 can include a bottom selective gate (BSG) 410 at its source end and a top selective gate (TSG) 412 at its drain end. BSG 410 and TSG 412 can be configured to activate selected NAND-memory strings 408 during read and program operations. In some examples, the sources of NAND-memory strings 408 in a same block 404 are coupled through a same source line (SL) 414, e.g., a common SL. In other words, all NAND-memory strings 408 in the same block 404 have an array common source (ACS), according to some examples. TSG 412 of each NAND-memory string 408 is coupled to a respective bit line (BL) 416 from which data can be read or written via an output bus (not shown), according to some examples. In some examples, each NAND-memory string 408 is configured to be selected or deselected by at least one of applying a select voltage (e.g., above the threshold voltage of the transistor having TSG 412) or a deselect voltage (e.g., 0 V) to respective TSG 412 through one or more TSG lines 413 or applying a select voltage (e.g., above the threshold voltage of the transistor having BSG 410) or a deselect voltage (e.g., 0 V) to respective BSG 410 through one or more BSG lines 415.

As shown in FIG. 4, NAND-memory strings 408 can be organized into multiple blocks 404, each of which can have a common source line 414, e.g., coupled to the ground. In some examples, each block 404 is the basic data unit for erase operations, e.g., all memory cells 406 on the same block 404 are erased at the same time. To erase memory cells 406 in a selected block 404, source lines 414 coupled to selected block 404 as well as unselected blocks 404 in the same plane as selected block 404 can be biased with an erase voltage (Vers), such as a high positive voltage (e.g., 20 V or more). It is understood that in some examples, erase operations may be performed at a half-block level, a quarter-block level, or a level having any suitable number of blocks or any suitable fractions of a block. Memory cells 406 of adjacent NAND-memory strings 408 can be coupled through word lines 418 that select which row of memory cells 406 is affected by read and program operations.

Figure 5:
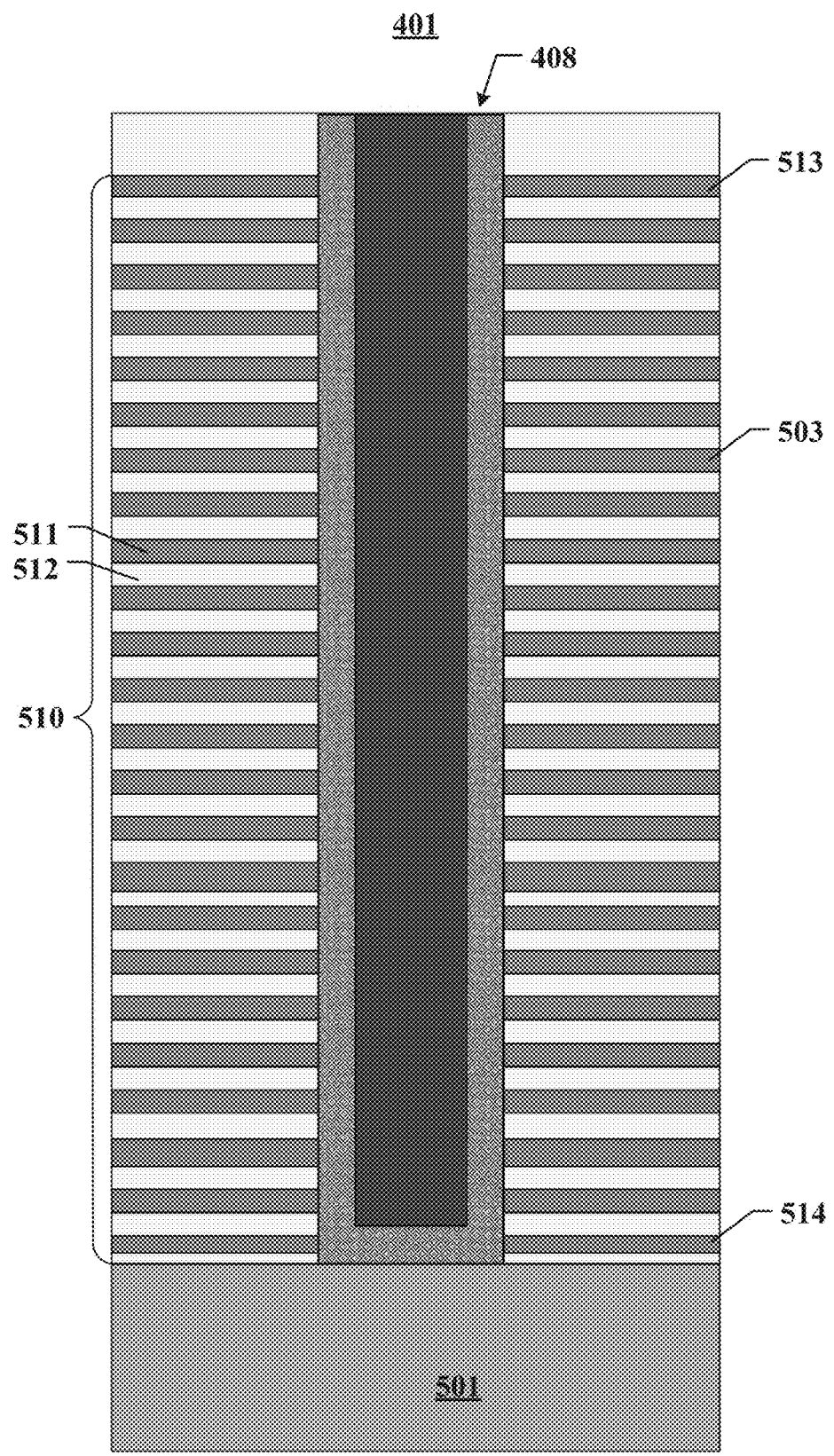
FIG. 5 is a schematic cross-sectional view of a memory array including NAND type memory strings, according to an example of the present disclosure.

FIG. 5 shows a schematic cross-sectional view of an example memory array 401 including NAND-memory strings 408 in accordance with some aspects of the present disclosure. As shown in FIG. 5, the NAND-memory string 408 may include a stacked structure 510, which includes a plurality of gate layers 511 and a plurality of insulating layers 512 alternately stacked in sequence, and a memory string 408 vertically penetrating through the gate layers 511 and the insulating layers 512. The gate layer 511 and the insulating layer 512 can be stacked alternately, and two adjacent gate layers 511 are separated by an insulating layer 512. The number of pairs of gate layers 511 and insulating layers 512 in the stacked structure 510 can determine the number of memory cells included in the memory array 401.

The constituent material of the gate layer 511 may include a conductive material. The conductive material may include but is not limited to tungsten (W), cobalt (Co), Copper (Cu), aluminum (Al), polysilicon, doped silicon, silicide, or any combination thereof. In some examples, each gate layer 511 may include a metal layer, e.g., a tungsten layer. In some examples, each gate layer 511 includes a doped polysilicon layer. Each gate layer 511 may include a control gate surrounding the memory cell. The gate layer 511 at the top of the stacked structure 510 may extend laterally as a top selective gate line, the gate layer 511 at the bottom of the stacked structure 510 may extend laterally as a bottom selective gate line, and the gate layer 511 extending laterally between the top selective gate line and the bottom selective gate line may be used as a word line layer 503.

In some examples, the stacked structure 510 may be disposed on a substrate 501. The substrate 501 may include silicon (e.g., monocrystalline silicon), silicon germanium (SiGe), gallium arsenide (GaAs), germanium (Ge), silicon-on-insulator (SOI), germanium-on-insulator (GOI), or any other suitable material.

In some examples, NAND-memory string 408 includes a channel structure extending vertically through the stacked structure 510. In some examples, the channel structure includes a channel hole filled with semiconductor material (s) (e.g., as a semiconductor channel) and dielectric material (s) (e.g., as a memory film). In some examples, the semiconductor channel includes silicon, e.g., polysilicon. In some examples, the memory film is a composite dielectric layer including a tunneling layer, a storage layer (also referred to as a "charge trap/storage layer"), and a blocking layer. The channel structure may have a cylindrical shape (e.g., a pillar shape). According to some examples, the semiconductor channel, the tunneling layer, the storage layer, and the blocking layer are radially arranged in this order from the center of the pillar toward the outer surface of the pillar. The tunneling layer may include silicon oxide, silicon oxynitride, or any combination thereof. The storage layer may include silicon nitride, silicon oxynitride, or any combination thereof. The blocking layer may include silicon oxide, silicon oxynitride, a high dielectric constant (high-k) dielectric, or any combination thereof. In one example, the memory film may include a composite layer of silicon oxide/silicon oxynitride/silicon oxide (ONO).

Figure 6:
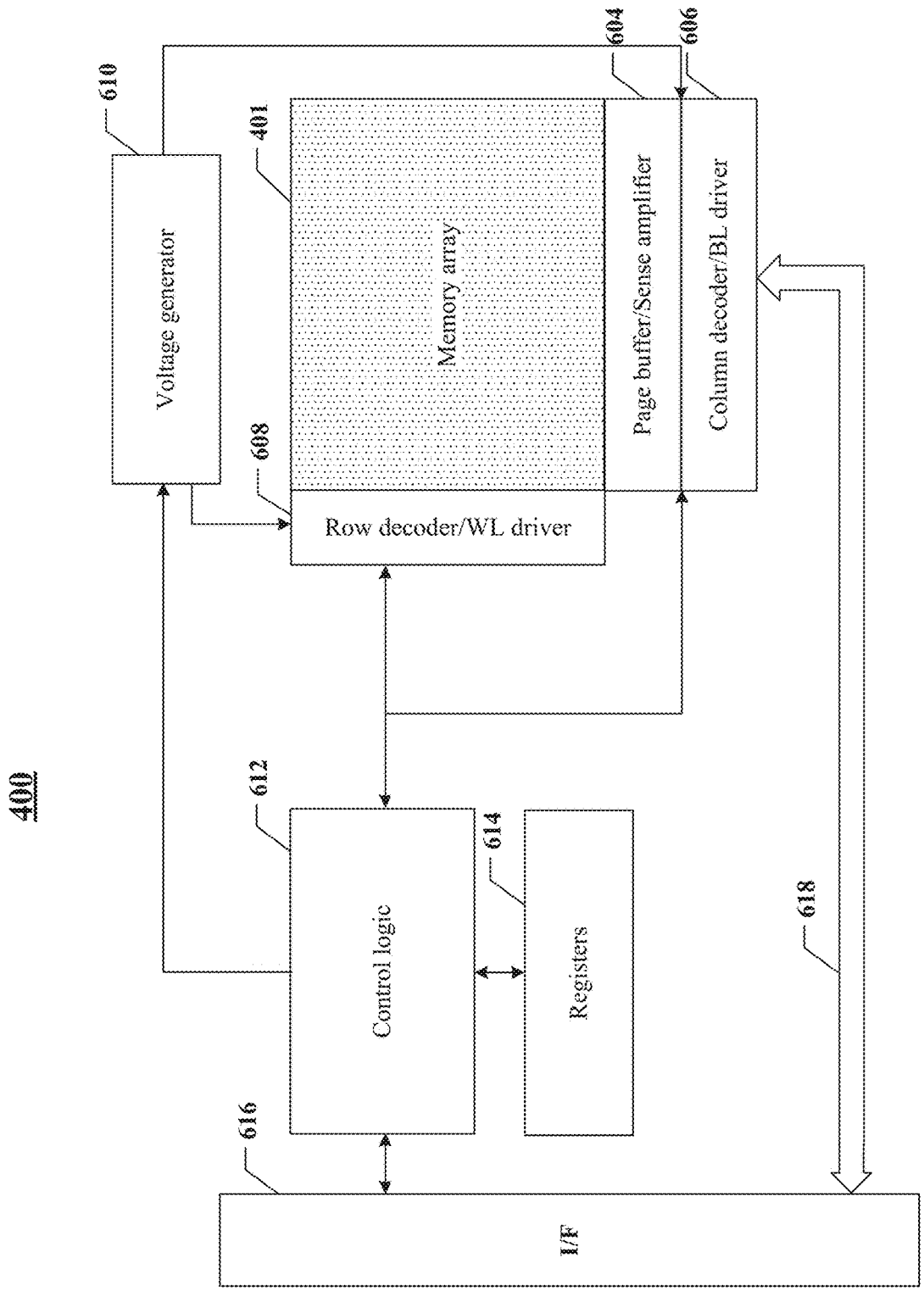
FIG. 6 is a schematic diagram of an example memory device including a memory array and peripheral circuits, according to an example of the present disclosure.

Referring back to FIG. 4, peripheral circuits 402 can be coupled to memory array 401 through bit lines 416, word lines 418, source lines 414, BSG lines 415, and TSG lines 413. Peripheral circuits 402 can include any suitable analog, digital, and mixed-signal circuits for facilitating the operations of memory array 401 by applying and sensing at least one of voltage signals or current signals to and from each target memory cell 406 through bit lines 416, word lines 418, source lines 414, BSG lines 415, and TSG lines 413. Peripheral circuits 402 can include various types of circuits formed using metal-oxide-semiconductor (MOS) technologies. For example, FIG. 6 illustrates some example peripheral circuits, the peripheral circuits 402 including a page buffer/sense amplifier 604, a column decoder/bit line driver 606, a row decoder/word line driver 608, a voltage generator 610, control logic 612, registers 614, an interface 616, and a data bus 618. It is understood that in some examples, additional peripheral circuits not shown in FIG. 6 may be included as well.

Page buffer/sense amplifier 604 can be configured to read and program (write) data from and to memory array 401 according to the control signals from control logic 612. In one example, page buffer/sense amplifier 604 may store program data (write data) to be programmed into memory array 401. In another example, page buffer/sense amplifier 604 may perform program verify operations to ensure that the data has been properly programmed into memory cells 406 coupled to selected word lines 418. In still another example, page buffer/sense amplifier 604 may also sense the low power signals from bit line 416 that represents a data bit stored in memory cell 406 and amplify the small voltage swing to recognizable logic levels in a read operation. Column decoder/bit line driver 606 can be configured to be controlled by control logic 612 and select one or more NAND-memory strings 408 by applying bit line voltages generated from voltage generator 610.

Row decoder/word line driver 608 can be configured to be controlled by control logic 612 and select/deselect blocks 404 of memory array 401 and select/deselect word lines 418 of block 404. Row decoder/word line driver 608 can be further configured to drive word lines 418 using word line voltages generated from voltage generator 610. In some examples, row decoder/word line driver 608 can also select/deselect and drive BSG lines 415 and TSG lines 413 as well. Row decoder/word line driver 608 is configured to perform program operations on the memory cells 406 coupled to the selected word line(s) 418. Voltage generator 610 can be configured to be controlled by control logic 612 and generate the word line voltages (e.g., read voltage, program voltage, pass voltage, channel boost voltage, verification voltage, etc.), bit line voltages, and source line voltages to be supplied to memory array 401.

Control logic 612 can be coupled to each peripheral circuit described above, such as voltage generator 610, row decoder/word line driver 608, etc., and configured to control operations of each peripheral circuit. Registers 614 can be coupled to control logic 612 and include status registers, command registers, and address registers for storing status information, command operation codes (OP codes), and command addresses for controlling the operations of each peripheral circuit. Interface 616 may be coupled to control logic 612 and act as a control buffer to buffer and relay control commands received from a host (not shown) to control logic 612, and to buffer and relay status information received from control logic 612 to the host. Interface 616 may further be coupled to column decoder/bit line driver 606 via data bus 618 and act as a data I/O interface and data buffer to buffer and relay data to or from memory array 401.

Among 3D NAND-type memory devices, SLC occupies a certain share in the memory market due to its advantages such as fast read and write speed, high reliability and long service life, whereas MLC, TLC, QLC have become the development trend of the memory market due to their higher storage density and larger storage capacity.

However, as the number of memory bits of the memory cell increases and the number of stacked layers increases, the types of errors it contains become more and more complex. When performing a read operation on the memory device, LDPC hard-decision decoding is used to code the codeword to be decoded, the decoding time is longer, and the error correction ability is weak, which seriously affects the reading rate.

Figure 7:
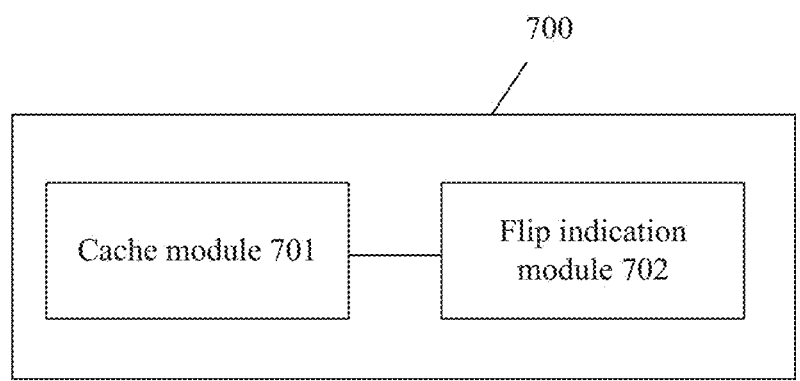
FIG. 7 is a schematic structural diagram of a decoder, according to an example of the present disclosure.

Based on the memory device and memory system described above, in order to solve one or more of the above-mentioned problems, reference is made to FIG. 7. FIG. 7 is a schematic structural diagram of a decoder, according to an example of the present disclosure.

In some examples, the decoder 700 includes a cache module 701 and a flip-indication module 702. The cache module 701 may be configured to cache soft data related to the codeword to be decoded. The flip-indication module 702 may be configured to obtain the soft data from the cache module 701. When performing hard-decision decoding on the codeword to be decoded, the flip-indication module 702 may be configured to determine, at least in a first flip iteration and with assistance of the soft data, a number of parity checks not satisfied by bits in the codeword to be decoded.

It should be noted that the decoder provided by the example of the present disclosure can be applied to the aforementioned memory system, and the decoder 700 can be set in the decoding section of the memory controller as shown in FIG. 3 and configured to perform a decoding operation on the codeword to be decoded. The code word to be decoded herein may refer to hard-read data, which may be read by the memory controller from the memory device according to a hard read voltage, or the code word to be decoded may also be the codeword flipped in a certain iteration during the decoding. Whether the codeword to be decoded is the hard-read data or the codeword flipped in a certain iteration will be described in detail in the subsequent description, and will not be repeated here.

Here, the hard read voltage may be an initial read voltage, and the initial read voltage is the default read voltage preset by the memory system, which may be the same as a reference voltage in the Read Retry Table (RRT), or have a certain offset from the reference voltage, and the offset is included in the RRT. Alternatively, the hard read voltage may also be an optimal read voltage. The way to obtain the optimal read voltage includes but is not limited to, e.g., determining the optimal read voltage according to the use of the memory device and the RRT. This process may include, e.g., traversing the RRT, determining a voltage offset in the RRT with the least error when reading memory device in this use case, and then, obtaining the optimal read voltage based on the reference voltage and the determined voltage offset.

It should be noted that the RRT is a table including multiple voltage offsets, where each voltage offset is relative to a reference voltage. These voltage offsets can be realized by hardware circuits in the memory. For example, these voltage offsets can be set through registers included in the memory. In other words, the required voltage offsets for all the read voltages are obtained based on the RRT table, and are then superimposed with the reference voltage (including the superposition of signs, that is, if the voltage offset is negative, the final read voltage is lower than the reference voltage) to obtain the required voltage value, which is then applied to the corresponding word line.

Referring to Table 1, the RRT corresponds to a TLC type memory cell, according to the example of the present disclosure. Each column in Table 1 represents a set of voltage offsets, i.e., Rd1 to Rd7, that distinguish adjacent programming states relative to the corresponding reference voltages. It should be noted that since the TLC type memory cell has 8 data states, it can be distinguished by using 7 read voltages, that is, there are 7 columns in Table 1.

The set of voltage offsets described above may include a positive offset that increases toward a direction greater than the reference voltage, and a negative offset that decreases toward a direction smaller than the reference voltage. For example, for Rd7, +V1, +V2, +V3, +V4 are positive offsets, the values of V1, V2, V3, and V4 increase sequentially, the values −V5 to −V11 are negative offsets, and the values of V5 to V11 decrease sequentially.

TABLE 1

| RRT | | | | | | |
|---|---|---|---|---|---|---|
| Rd1 | Rd2 | Rd3 | Rd4 | Rd5 | Rd6 | Rd7 |
| — | — | — | — | — | — | 0 |
| — | — | — | — | — | — | +V1 |
| — | — | — | — | — | — | +V2 |
| — | — | — | — | — | — | +V3 |
| — | — | — | — | — | — | +V4 |
| — | — | — | — | — | — | −V5 |
| — | — | — | — | — | — | −V6 |
| — | — | — | — | — | — | −V7 |
| — | — | — | — | — | — | −V8 |
| — | — | — | — | — | — | −V9 |
| — | — | — | — | — | — | −V10 |
| — | — | — | — | — | — | −V11 |

Returning to the decoder shown in FIG. 7, the soft data used in the decoder can be a kind of probability information used to measure the reliability of certain read data (such as the hard-read data in the example of the present disclosure), which can be represented by a Log-Likelihood Ratio (LLR). Therefore, there will be read data as a benchmark for soft data to measure its reliability.

Figure 8:
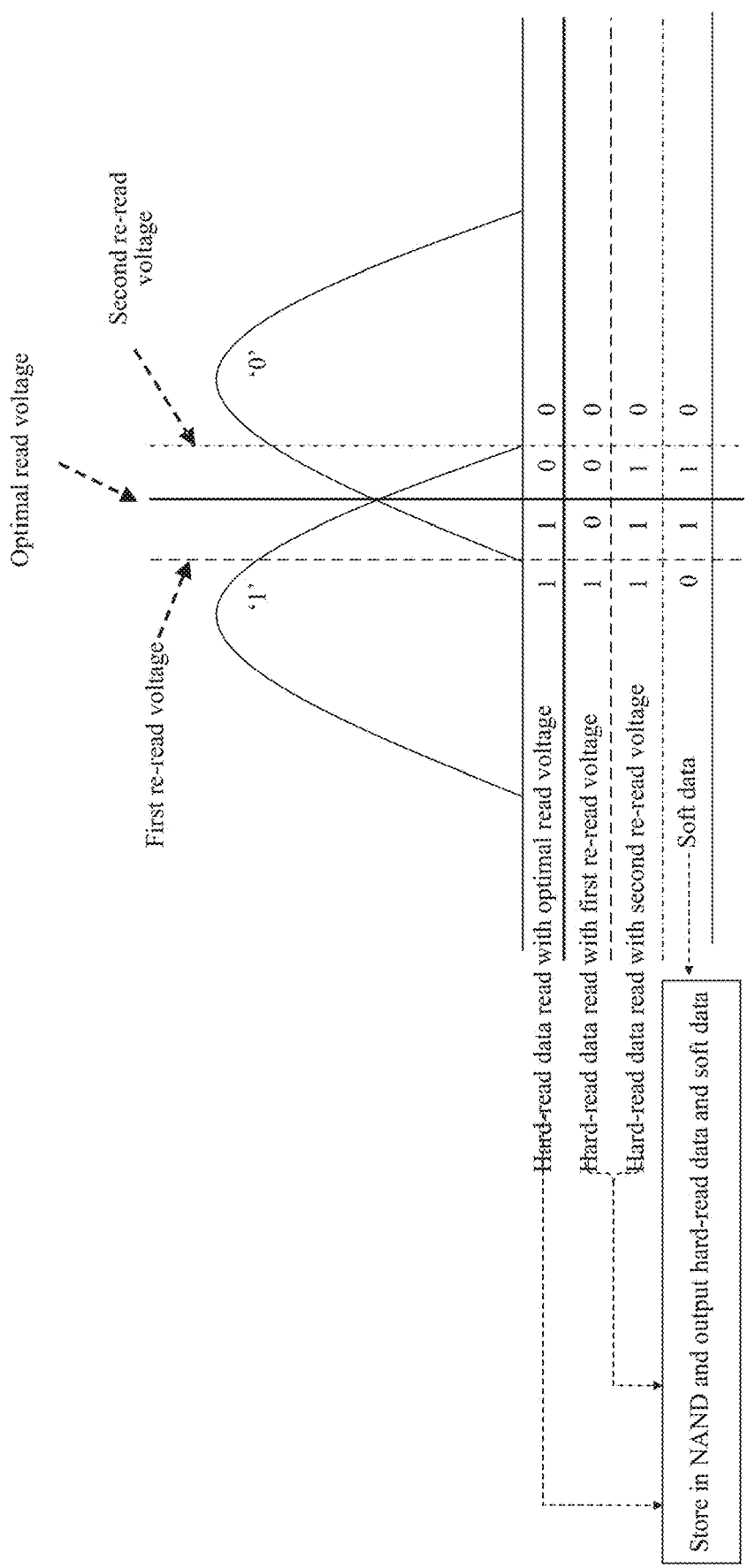
FIG. 8 is an example schematic diagram of acquiring soft data and hard-read data, according to an example of the present disclosure.

Reference may be made to FIG. 8 for the soft data. In FIG. 8, it is assumed that the hard-read data read with an optimal read voltage is 1100, the data read with a first re-read voltage is 1000. In this example the first re-read voltage is on the left side of the optimal read voltage and deviates from the optimal read voltage with a certain offset, which denoted as −Δ. The data read with a second re-read voltage is 1110, where the second re-read voltage is on the right side of the optimal read voltage and deviates from the optimal read voltage with a certain offset, denoted as +Δ. Correspondingly, the soft data can be 0110. In this case, the soft data can be used to determine the reliability of the hard-read data 1100/1000/1110. In some examples, the soft data is used to determine the reliability of the hard-read data, where the bit of "0" in the soft data indicates that the reliability of that bit in the hard-read data is relatively higher. In other words, that bit is determined to be closer to the truth. A bit of "1" in the soft data indicates that the reliability of that bit in the hard-read data is weaker. For example, in FIG. 8, a determination of the reliability of the hard-read data 1100 may be performed by using the soft data 0110, the leftmost bit of the hard-read data 1100 is "1", the number corresponding to that bit in the soft data is "0", and thus the reliability of that bit is relatively higher, that is, a strong "1". By analogy, the middle two bits in the hard-read data 1100 correspond to "1"s in the soft data, thus the reliability of the middle two bits is weaker, that is, weak "1" or "0", and the rightmost bit of the hard-read data 1100 is a strong "0".

In some examples, the way of obtaining the soft data may include, as shown in FIG. 8, directly reading the soft data from a NAND-type memory device. In some examples, the memory controller may send a command to read soft data to the memory device, and the memory device feeds back the soft data to the memory controller. In some other examples, the soft data may also be based on the XOR result of two adjacent hard-read data pre-cached in the memory of the memory controller.

When performing hard-decision decoding on the codeword to be decoded, the decoder provided by the examples of the present disclosure obtains the soft data related to the codeword to be decoded that is buffered by the buffer module in the decoder, and then determines, with assistance of the soft data, a number of parity checks not satisfied by bits in the codeword to be decoded. The hard-decision decoding may be LDPC bit flip decoding. In LDPC bit-flip decoding, fast-read soft data is used to assist LDPC bit-flip decoding at least in a first flip iteration, so as to improve the correction capability of LDPC bit-flip decoding. The use of soft data to assist bit flip determination at least in the first flip iteration may be done only in the first flip iteration, or in the first flip iteration and the second flip iteration, or in multiple flip iterations and so on.

Here, the parity checks not satisfied may mean that after the codeword to be decoded is checked with the check matrix for a single time, each non-zero element in the generated checksum vector corresponds to that an equation of parity checks with which the bits in the codeword to be decoded engage is not satisfied. The number of parity checks not satisfied by the bits in the codeword to be decoded may refer to the number of equations of parity checks with which the bits in the codeword to be decoded engage that are non-zero elements.

By way of example, assuming that the codeword to be decoded is: C1C2C3C4C5C6C8C9C10C11C12, the checksum vectors that are satisfied in a single check are as follows:

$C3 \oplus C6 \oplus C7 \oplus C8 = 0;$ $C1 \oplus C2 \oplus C5 \oplus C12 = 1;$ $C4 \oplus C9 \oplus C10 \oplus C11 = 0;$ $C2 \oplus C6 \oplus C7 \oplus C10 = 1;$ $C1 \oplus C3 \oplus C8 \oplus C11 = 0;$ $C4 \oplus C5 \oplus C9 \oplus C12 = 0;$ $C1 \oplus C4 \oplus C5 \oplus C7 = 1;$ $C6 \oplus C8 \oplus C11 \oplus C12 = 0;$ and $C2 \oplus C3 \oplus C9 \oplus C10 = 0.$ In this case, the numbers of parity checks not satisfied by the bits in the codeword are respectively: C1: 2; C2: 2; C3: 0; C4: 1; C5: 2; C6: 1; C7: 1; C8: 0; C9: 0; C10: 1; C11: 0; C12: 1.

In some examples, the flip-indication module 702 may be further configured to determine an initial error bit indication vector corresponding to the codeword to be decoded. In some examples, the flip-indication module 702 may be further configured to determine, with assistance of the soft data in combination with the initial error bit indication vector, the number of parity checks not satisfied by the bits in the codeword to be decoded.

It should be noted that this operation in some examples is to use soft data to assist in determining the number of parity checks not satisfied by the bits in the codeword to be decoded. In some examples, the initial error bit indication vector of the codeword to be decoded is firstly determined. The initial error bit indication vector can refer to the number of parity checks not satisfied by the bits in the codeword to be decoded when only LDPC bit flip decoding is performed without using soft data assistance. Then, the number of parity checks not satisfied by the bits in the codeword to be decoded is determined with assistance of the soft data in combination with the initial error bit indication vector.

In some examples, the flip-indication module 702 may be further configured to determine a soft data vector corresponding to the soft data. In some examples, the flip-indication module 702 may be further configured to perform a sum operation on the soft data vector and the initial error bit indication vector to obtain a target error bit indication vector. In some examples, the flip-indication module 702 may be further configured to determine a number of parity checks not satisfied by each bit in the codeword to be decoded according to the target error bit indication vector. Each element in the target error bit indication vector may correspond to the number of parity checks not satisfied by one bit.

It should be noted that, how to determine, with assistance of the soft data in combination with the initial error bit indication vector, the number of parity checks not satisfied by the bits in the codeword to be decoded will be described below. In some examples, the soft data is first expressed in the form of a soft data vector. Then, a sum operation is performed on the soft data vector and the aforementioned initial error bit indication vector to obtain a target error bit indication vector, where each element in the target error bit indication vector corresponds to the number of parity checks not satisfied by one bit.

For example, assuming the initial error bit vector is: {0, 1, 1, 0}, the soft data vector corresponding to the soft data is {0, 1, 1, 0}, and the target error bit vector is: {0, 2, 2, 0}. Here, the number of parity checks not satisfied by the first bit in the codeword to be decoded is 0, the number of parity checks not satisfied by the second bit in the codeword to be decoded is 2, the number of parity checks not satisfied by the third bit in the codeword to be decoded is 2, and the number of parity checks not satisfied by the fourth bit in the codeword to be decoded is 0.

Figure 9:
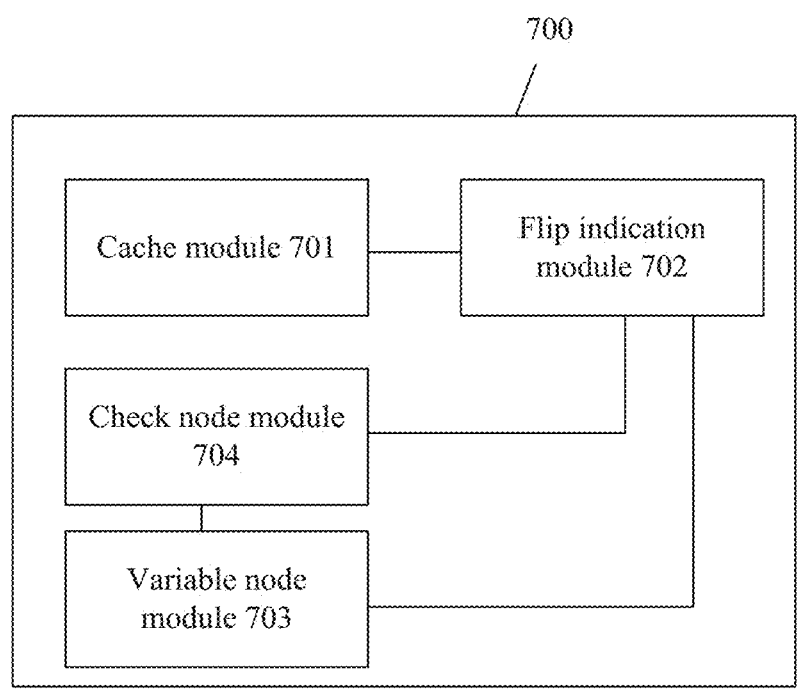
FIG. 9 is a schematic structural diagram of a decoder, according to another example of the present disclosure.

According to the example of the present disclosure, to obtain the initial error bit indication vector in some examples, as shown in FIG. 9, the decoder 700 further includes a variable-node module 703 and a check-node module 704. The node module and the check-node module are connected to form a variable-check connection network according to a pre-constructed check matrix. The variable-node module 703 may be configured to receive hard-read data and generate the codeword to be decoded according to the hard-read data. The variable-node module 703 may be configured to send the codeword to be decoded to the check-node module. The variable-node module 703 may be configured to send the codeword to be decoded and the hard-read data to the flip-indication module. The check-node module 704 may be configured to receive the codeword to be decoded; determine a checksum vector according to the codeword to be decoded and the check matrix. The check-node module 704 may be configured to send the checksum vector to the flip-indication module.

The flip-indication module 702 may be further configured to receive the codeword to be decoded and the hard-read data sent by the variable-node module. The flip-indication module 702 may be further configured to receive the checksum vector sent by the check-node module; obtain the check matrix and the soft data. The flip-indication module 702 may be further configured to determine the initial error bit indication vector corresponding to the codeword to be decoded according to the hard-read data, the codeword to be decoded, the checksum vector, and the check matrix.

It should be noted that the decoder shown in FIG. 7 discloses only the main structures related to the inventive concepts of the examples of the present disclosure. In LDPC bit flip decoding, the decoder can further include a variable-node module and a check-node module. Moreover, the variable-node module can include multiple variable node units, and the check-node module can include multiple check node units. The multiple variable node unit and multiple check node units are connected to form a variable-check connection network according to a pre-constructed check matrix. Here, the pre-constructed check matrix may refer to an LDPC check matrix, also called an H matrix.

Figure 10:
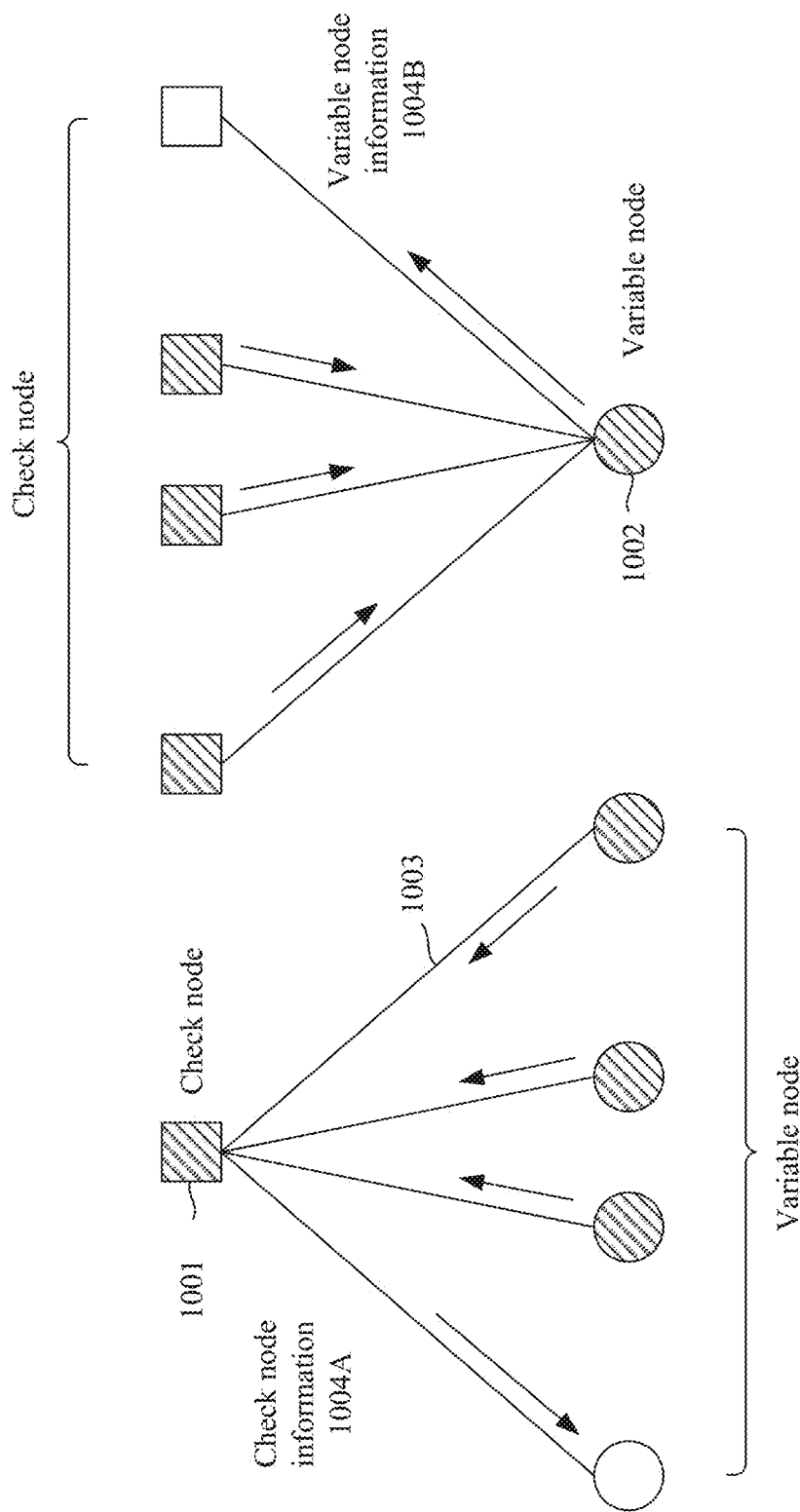
FIG. 10 is a schematic diagram of a Tanner graph, according to an example of the present disclosure.

As shown in FIG. 10, the variable-check connection network formed above can also be referred to as a Tanner graph. In FIG. 10, the Tanner graph includes a check node 1001, a variable node 1002, and an edge 1003 connecting the check node and the variable node. Values transferred from check nodes to variable nodes after check node processing are referred to as check node information 1004A. Values transferred from variable nodes to check nodes after variable node processing are referred to as variable node information 1004B.

Figure 11:
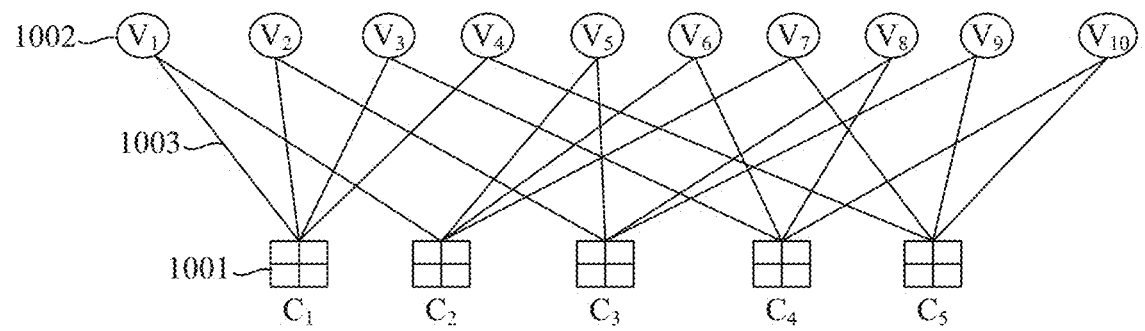
FIG. 11 is a schematic diagram of a Tanner graph, according to an example of the present disclosure.

As an example, with reference to FIG. 11, the Tanner graph includes 5 check nodes 1001 of the parity check equation of the H matrix, 10 variable nodes 1002 representing code symbols, and edges 1003 representing the relationship between the check nodes and the variable nodes. The edge 1003 connects each check node to a variable node corresponding to a code symbol included in a parity check equation represented by the check node. FIG. 11 shows a Tanner graph formed by an H matrix, where the number of variable nodes connected to each check node is fixed at 4, and the number of check nodes connected to each variable node is fixed at 2. An initial value of a variable node can be hard-read data.

Under the decoder structure shown in FIG. 9, the variable-node module can receive hard-read data and generate the codeword to be decoded according to the hard-read data, send the codeword to be decoded to a check-node module, and send the codeword to be decoded and the hard-read data to the flip-indication module. The check-node module can receive the codeword to be decoded, determine a checksum vector according to the codeword to be decoded and the aforementioned check matrix, and send the checksum vector to the flip-indication module. The flip-indication module can receive the aforementioned codeword to be decoded, hard-read data, checksum vector, obtain the check matrix, and obtain the initial error bit indication vector according to the codeword to be decoded, hard-read data, the checksum vector and the check matrix.

It should be noted that, based on the above description, the decoder can be located in the decoding section of the memory controller. Therefore, the hard-read data received by the variable-node module may be the read command in response to the processor. In this case, the read data fed back by the memory device via the memory I/F is directly transmitted to the variable-node module via the bus. Alternatively, the hard-read data received by the variable-node module may be the read command in response to the processor. In this case, the read data fed back by the memory device via the memory I/F is temporarily stored in the memory, and the hard-read data is obtained from the memory by the processor and transmitted to the variable-node module. Any other processes that can obtain hard-read data are possible. In general, the decoder may be inside the memory controller, and may be coupled with other components such as the processor via a bus. Therefore, the variable-node module can receive hard-read data from outside the decoder. After the variable-node module receives the hard-read data, the value of each bit of the hard-read data is assigned to the corresponding variable node unit to generate a codeword to be decoded.

Determining the checksum vector according to the codeword to be decoded and the aforementioned check matrix may be implemented by multiplying the check matrix by the transposition of the codeword to be decoded to obtain the checksum vector.

For the initial error bit indication vector obtained (e.g., by using the codeword to be decoded, hard-read data, checksum vector and check matrix), the flip-indication module 702 may be further configured to perform a sum operation on the hard-read data and the codeword to be decoded and then perform a modulo operation on the sum to obtain a first bit vector. For the initial error bit indication vector obtained (e.g., by using the codeword to be decoded, hard-read data, checksum vector and check matrix), the flip-indication module 702 may be further configured to multiply transposition of the checksum vector by the check matrix to obtain a second bit vector. For the initial error bit indication vector obtained (e.g., by using the codeword to be decoded, hard-read data, checksum vector and check matrix), the flip-indication module 702 may be further configured to perform a sum operation on the first bit vector and the second bit vector to obtain the initial error bit indication vector.

It should be noted that what is described herein is the various, non-limiting operations of how to obtain the initial error bit indication vector by using the codeword to be decoded, the hard-read data, the checksum vector, and the check matrix. In some examples, the first bit vector may be obtained by performing a sum operation on the hard-read data (the codeword to be decoded in the first iterative flip) and the codeword to be decoded and then perform a modulo operation on the sum. A second bit vector may be obtained by multiplying transposition of the checksum vector by the check matrix. Then, the aforementioned initial error bit indication vector may be obtained by performing a sum operation on the first bit vector and the second bit vector. Here, the number of elements in the first bit vector and the second bit vector is the same as the number of bits in the codeword to be decoded.

In some examples, the calculation process above can be described in the following formula (1):

$$f1 = (y + y_0) \bmod 2 + s'H, \quad (1)$$

where f1 is the initial error bit indication vector, and each element corresponds to a bit in the codeword to be decoded, y is the codeword to be decoded, $y_0$ is the hard-read data, s' is the transposition of the checksum vector, and H is a check matrix.

It should be noted that in the first flip iteration, $y=y_0$. That is, in the first flip iteration, the codeword to be decoded is the hard-read data, and in the remaining flip iterations, the codeword to be decoded is hard-read data after bit flipping.

Based on this, in the example of the present disclosure, the target error bit indication vector can be expressed in the following formula (2):

$$f2 = (y + y_0) \bmod 2 + s'H + R, \quad (2)$$

where f2 is the target error bit indication vector, and R is the soft data.

In some examples, the flip-indication module 702 may be further configured to generate a flip-indication vector according to the number of parity checks not satisfied and a flipping criterion. The flip-indication vector may include determined bits that need to be flipped in the codeword to be decoded. In some examples, the variable-node module 703 may be further configured to receive the flip-indication vector, and flip the bits that need to be flipped in the codeword to be decoded according to the flip-indication vector.

In some implementations, the flipping criterion may include flipping the bits in the codeword to be decoded for which the number of parity checks not satisfied is largest. In some implementations, the flipping criterion may include flipping the bits in the codeword to be decoded for which the number of parity checks not satisfied is greater than or equal to a preset threshold.

It should be noted that after the target error bit indication vector is obtained, the number of parity checks not satisfied by each bit in the codeword to be decoded may be obtained. Afterwards, the flip-indication module obtains a flip-indication vector according to the obtained number of parity checks not satisfied by each bit and the flipping criterion. After that, the variable-node module flips the bits to be flipped in the codeword to be decoded according to the flip-indication vector. Here, the flipping criterion here include but are not limited to flipping the bits in the codeword to be decoded for which the number of parity checks not satisfied is largest, and flipping the bits in the codeword to be decoded for which the number of parity checks not satisfied is greater than or equal to a preset threshold. In the above description, only the bit corresponding to the largest data in f2 is flipped; or alternatively, the bit whose data in f2 is greater than or equal to T (that is, the preset threshold) is flipped.

Figure 12:
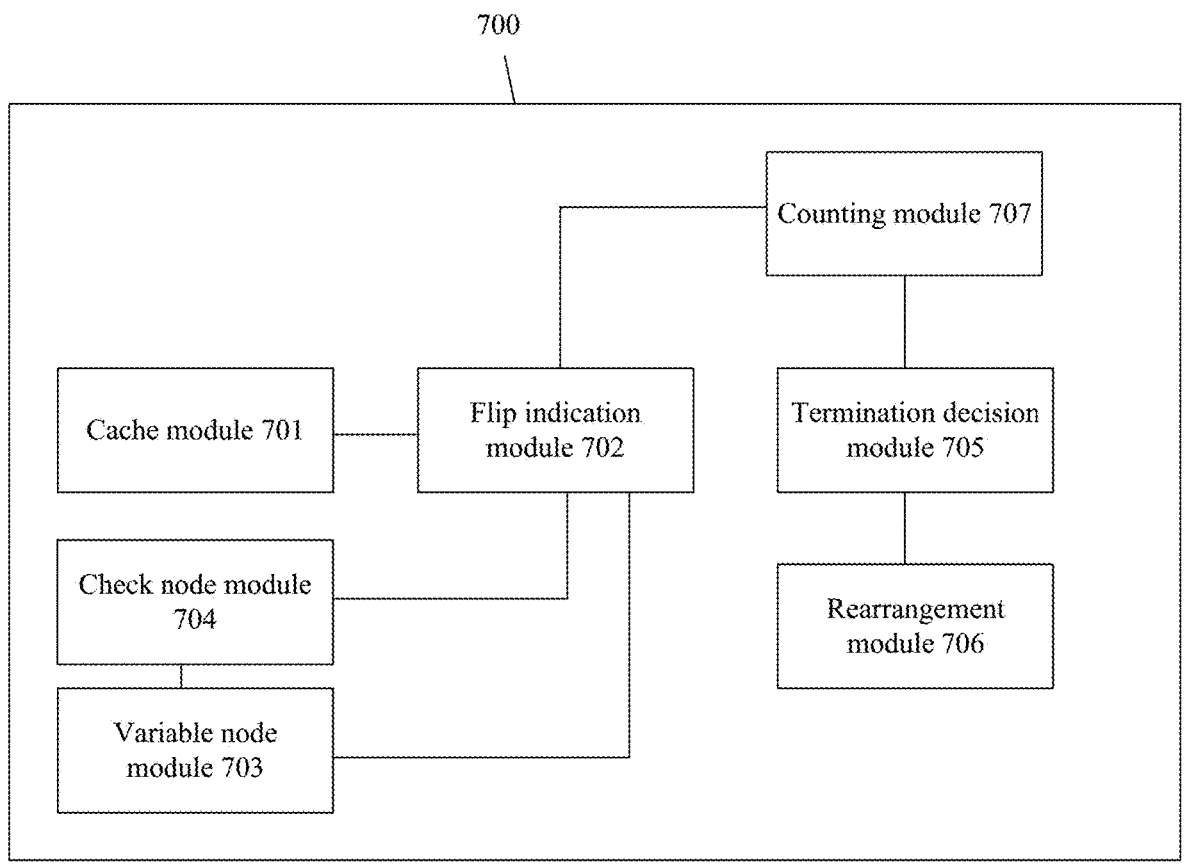
FIG. 12 is a schematic structural diagram of a decoder according to another example of the present disclosure.

In some examples, as shown in FIG. 12, the decoder 700 may further include a counting module 707 and a termination-decision module 705. The counting module 707 may be configured to count a number of iterations of the hard-decision decoding performed on the codeword to be decoded. The termination-decision module 705 may be configured to determine whether the number of iterations reaches a maximum number of iterations and determine whether the checksum vector is a zero vector; and when the number of iterations reaches the maximum number of iterations and the checksum vector is a non-zero vector, the termination-decision module 705 may be configured to output a first stop decoding signal. The first stop decoding signal may indicate that the hard-decision decoding of the codeword to be decoded fails.

It should be noted that in hard-decision decoding, the number of flipping iterations is limited. The number of flipping iterations can be counted by the counting module 707, that is, the number of iterations is counted by the counting module 707. Afterwards, the termination-decision module 705 determines whether the counted number of iterations reaches the maximum number of iterations and whether the checksum vector is a zero vector. When the maximum number of iterations is reached and the checksum vector is a non-zero vector, a first stop decoding signal is output. The first stop decoding signal is used to indicate that the hard-decision decoding of the codeword to be decoded fails.

In some examples, the decoder 700 may further include a rearrangement module 706. The termination-decision module 705 may be further configured to, when it is determined that the checksum vector is a zero vector, output a second stop decoding signal. The second stop decoding signal may indicate that the hard-decision decoding of the codeword to be decoded is successful. The rearrangement module 706 may be configured to, in response to the second stop decoding signal, perform rearrangement processing on the codeword to be decoded. The rearrangement module 706 may be configured to output codeword to be decoded in a correct order.

It should be noted that the termination-decision module 705 outputs a second stop decoding signal, and the rearrangement module 706, in response to the second stop decoding signal, performs rearrangement processing on the codeword to be decoded, and outputs codeword to be decoded in a correct order, so as to complete the decoding of hard-read data.

In some examples, the termination-decision module 705 may be further configured to, when the checksum vector is not a zero vector and the number of iterations has not reached the maximum number of iterations, output a continue-coding signal. The continue-coding signal may instruct the variable-node module 703, the check-node module and the flip-indication module to continue to perform a hard-decision decoding operation on the codeword to be decoded.

It should be noted that, the operations here may refer to the terminating decision module outputting a continue-coding signal when the checksum vector is not a zero vector and the number of iterations has not reached the maximum number of iterations. The continue-coding signal is configured to indicate the aforementioned variable-node module 703, the check-node module 704, and the flip-indication module 702 to continue to perform hard-decision decoding operations on the codeword to be decoded, so as to determine whether the decoding of codeword to be decoded succeeds or fails.

Figure 13:
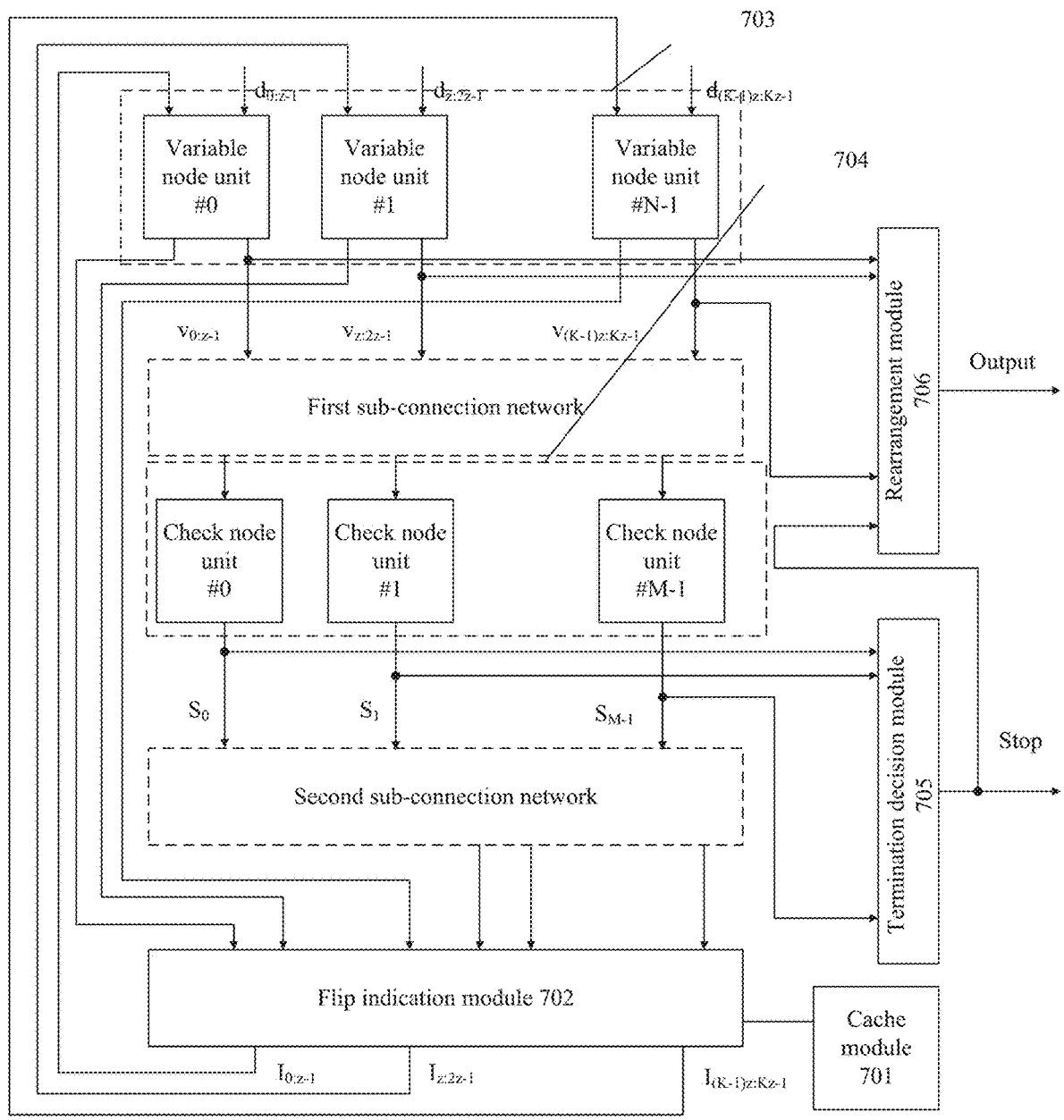
FIG. 13 is a schematic structural diagram of a decoder, according to another example of the present disclosure.

Based on the above description, as shown in FIG. 13, it shows a schematic structural diagram of a decoder according to an example of the present disclosure. It should be noted that, in FIG. 13, d represents the hard-read data, v represents the codeword to be decoded, S represents the checksum vector, I represents the flip-indication vector, and Stop is the stop decoding signal, including the first stop decoding signal and a second stop decoding signal. Here, a first sub-connection network and a second sub-connection network together form a variable-check node connection network.

Figure 14:
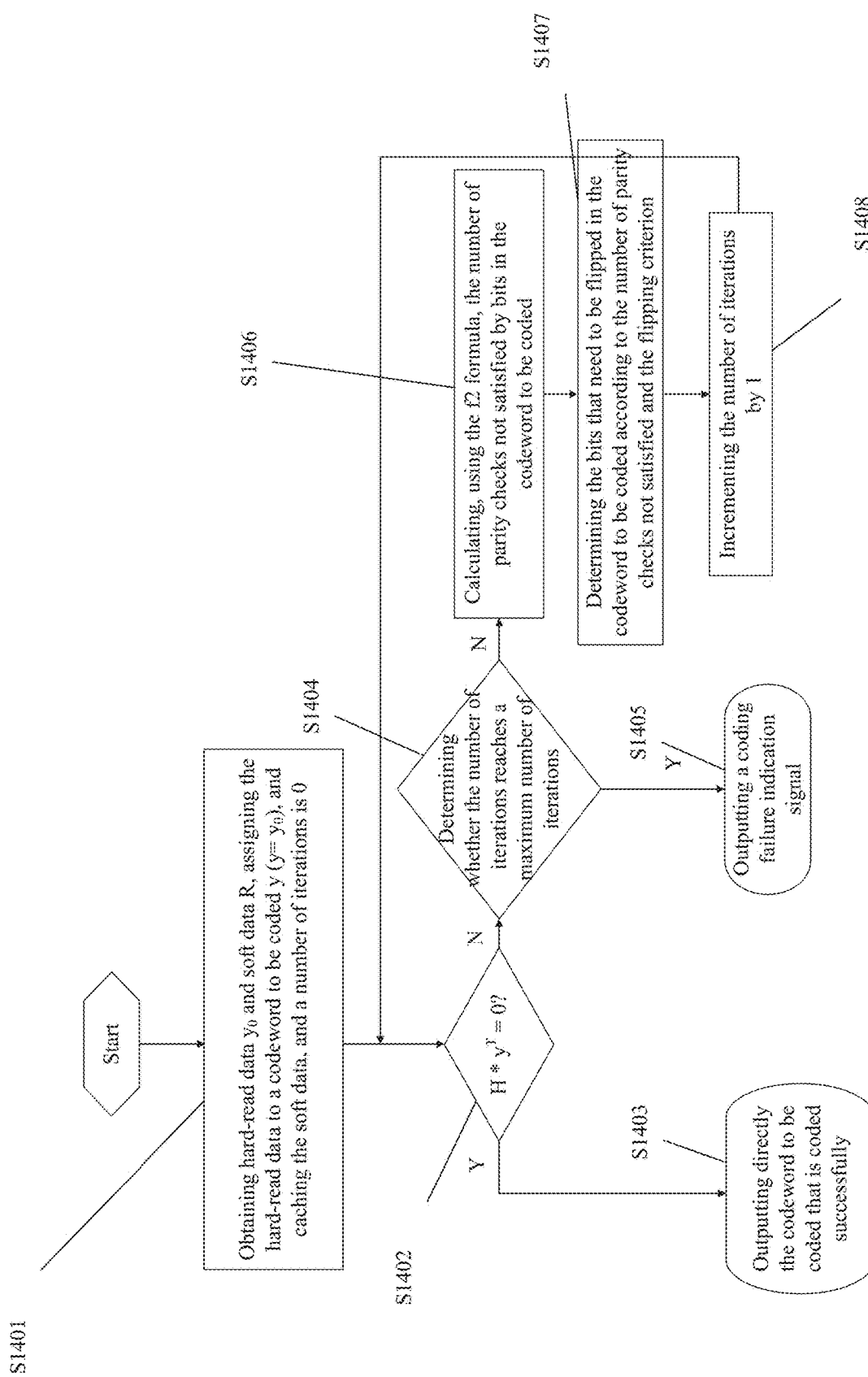
FIG. 14 is a schematic diagram of a workflow of a decoder, according to an example of the present disclosure.

Based on the decoder shown in FIG. 13, the decoding workflow provided by the example of the present disclosure may be shown in FIG. 14. In some examples, an implementable decoding workflow can be performed according to the following operations S1401-S1408

For example, at S1401, the method may include obtaining hard-read data $y_0$ and soft data R, assigning the hard-read data to a codeword to be decoded y ($y=y_0$), and caching the soft data; a number of iterations is 0; here, $y_0$ is the d in FIG. 13, and y is the v in FIG. 13.

At S1402, the method may include generating a checksum vector by using a check matrix and the codeword to be decoded, and determining whether the checksum vector is a zero vector (that is, $H*y^T=0$?); if yes, executing S1403; and if not, executing S1404.

At S1403, the method may include outputting the codeword to be decoded that is decoded successfully, and ending the process.

At S1404, the method may include determining whether the number of iterations reaches a maximum number of iterations; if yes, executing S1305; and if not, executing S1406.

At S1405, the method may include outputting a decoding failure indication signal, for example, the first stop decoding signal.

At S1406, the method may include calculating, using the f2 formula, the number of parity checks not satisfied by bits in the codeword to be decoded.

At S1407, the method may include determining the bits that need to be flipped in the codeword to be decoded according to the number of parity checks not satisfied and the flipping criterion.

At S1408, the method may include incrementing the number of iterations by 1, continuing to enter the next iteration, continuing to execute S1402 to S1408 in sequence until the decoding succeeds or fails, and ending the process.

It should be noted that the methods for obtaining the hard-read data and soft data in operation S1401 have been described above. That is, the hard-read data can be obtained by directly receiving feedback from the memory device or from the memory of the memory controller. The soft data can be cached into the cache module of the decoder, and then obtained from the cache module. The above-mentioned operations are merely one way of implementing the decoding workflow. The execution order of each operation can be adjusted according to the actual situation. For example, S1404 can occur before S1402, and in this case, it is firstly determined whether the number of iterations reaches the maximum number of iterations, and if the maximum number of iterations has not reached, a checksum vector is generated by using check matrix and the codeword to be decoded; otherwise, outputting a decoding failure indication signa, and ending the process.

In accordance with the decoder provided by the examples of the present disclosure, the soft data is applied to LDPC bit flipping (e.g., hard-decision) decoding. The strong error-correction capability of soft data is leveraged to speed up the LDPC bit flipping decoding, so as to reduce the power consumed by LDPC bit flipping decoding and improve the throughput of error correction of the decoder.

Figure 15:
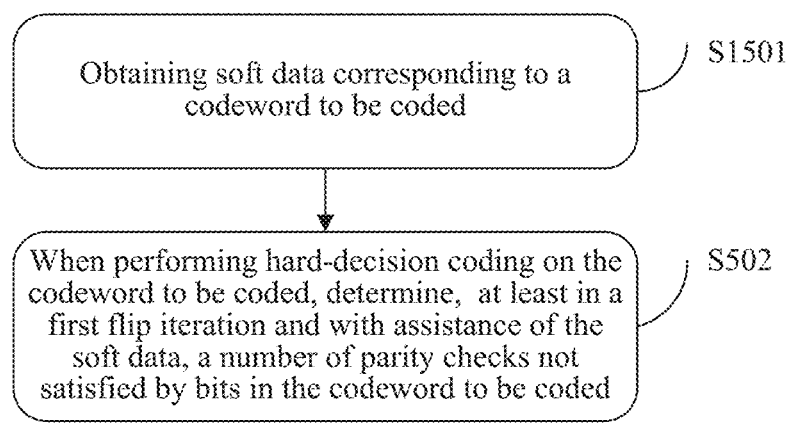
FIG. 15 is a schematic flowchart of a decoding method, according to an example of the present disclosure.

An example of the present disclosure also provides a decoding method, as shown in FIG. 15, may include operations S1501 and S1502.

For example, at S1501, the method may include obtaining soft data corresponding to a codeword to be decoded.

At S1502, the method may include, when performing hard-decision decoding on the codeword to be decoded, determining, at least in a first flip iteration and with assistance of the soft data, a number of parity checks not satisfied by bits in the codeword to be decoded.

In some examples, the determining, with assistance of the soft data, the number of parity checks not satisfied by the bits in the codeword to be decoded may include determining an initial error bit indication vector corresponding to the codeword to be decoded. In some examples, the determining, with assistance of the soft data, the number of parity checks not satisfied by the bits in the codeword to be decoded may include determining, with assistance of the soft data in combination with the initial error bit indication vector, the number of parity checks not satisfied by the bits in the codeword to be decoded.

In some examples, the determining, with assistance of the soft data in combination with the initial error bit indication vector, the number of parity checks not satisfied by the bits in the codeword to be decoded may include determining a soft data vector corresponding to the soft data. In some examples, the determining, with assistance of the soft data in combination with the initial error bit indication vector, the number of parity checks not satisfied by the bits in the codeword to be decoded may include performing a sum operation on the soft data vector and the initial error bit indication vector to obtain a target error bit indication vector. In some examples, the determining, with assistance of the soft data in combination with the initial error bit indication vector, the number of parity checks not satisfied by the bits in the codeword to be decoded may include determining a number of parity checks not satisfied by each bit in the codeword to be decoded according to the target error bit indication vector. Each element in the target error bit indication vector corresponds to the number of parity checks not satisfied by one bit.

In some examples, the determining the initial error bit indication vector corresponding to the codeword to be decoded may include receiving hard-read data and generating the codeword to be decoded according to the hard-read data. In some examples, the determining the initial error bit indication vector corresponding to the codeword to be decoded may include determining a checksum vector according to the codeword to be decoded and a pre-constructed check matrix. In some examples, the determining the initial error bit indication vector corresponding to the codeword to be decoded may include determining the initial error bit indication vector corresponding to the codeword to be decoded according to the hard-read data, the codeword to be decoded, the checksum vector, and the check matrix.

In some examples, the determining the initial error bit indication vector corresponding to the codeword to be decoded according to the hard-read data, the codeword to be decoded, the checksum vector, and the check matrix may include performing a sum operation on the hard-read data and the codeword to be decoded and then perform a modulo operation on the sum to obtain a first bit vector. In some examples, the determining the initial error bit indication vector corresponding to the codeword to be decoded according to the hard-read data, the codeword to be decoded, the checksum vector, and the check matrix may include multiplying transposition of the checksum vector by the check matrix to obtain a second bit vector. In some examples, the determining the initial error bit indication vector corresponding to the codeword to be decoded according to the hard-read data, the codeword to be decoded, the checksum vector, and the check matrix may include performing a sum operation on the first bit vector and the second bit vector to obtain the initial error bit indication vector.

In some examples, the method may further include generating a flip-indication vector according to the number of parity checks not satisfied and a flipping criterion. The flip-indication vector may include determined bits that need to be flipped in the codeword to be decoded. In some examples, the determining the initial error bit indication vector corresponding to the codeword to be decoded according to the hard-read data, the codeword to be decoded, the checksum vector, and the check matrix may include flipping the bits that need to be flipped in the codeword to be decoded according to the flip-indication vector.

In some examples, the flipping criterion may include flipping the bits in the codeword to be decoded for which the number of parity checks not satisfied is largest. In some examples, the flipping criterion may include flipping the bits in the codeword to be decoded for which the number of parity checks not satisfied is greater than or equal to a preset threshold.

In some examples, the method may further include counting a number of iterations of the hard-decision decoding performed on the codeword to be decoded. In some examples, the method may further include determining whether the number of iterations reaches a maximum number of iterations and determining whether the checksum vector is a zero vector. In some examples, the method may further include, when the number of iterations reaches the maximum number of iterations and the checksum vector is a non-zero vector, outputting a first stop decoding signal. The first stop decoding signal may indicate that the hard-decision decoding of the codeword to be decoded fails.

In some examples, the method may further include determining whether the checksum vector is a zero vector, and when it is determined that the checksum vector is a zero vector, outputting a second stop decoding signal. In some examples, the method may further include, in response to the second stop decoding signal, performing rearrangement processing on the codeword to be decoded; and outputting codeword to be decoded in a correct order.

In some examples, the method may further include, when the checksum vector is not a zero vector and the number of iterations has not reached the maximum number of iterations, output a continue-coding signal. The continue-coding signal may include an instruction to perform a hard-decision decoding operation on the codeword to be decoded.

It should be noted that the decoding method provided by the example of the present disclosure is actually the working process of the decoder provided above. The working process of the decoder has been described in detail above, and reference may be made to the above description for the terms and features appearing herein, which will not be repeated here.

Figure 16:
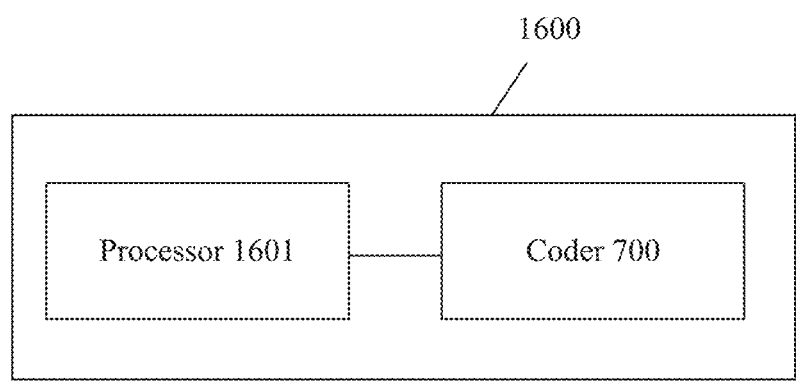
FIG. 16 is a schematic structural diagram of a memory controller, according to an example of the present disclosure.

An example of the present disclosure further provides a memory controller 1600, as shown in FIG. 16, including: a processor 1601 and the decoder 700 described in any one of the above aspects. The processor 1601 may be configured to read soft data corresponding to a codeword to be decoded from a memory device. The decoder 700 may be configured to cache the soft data; and when performing hard-decision decoding on the codeword to be decoded, determine, at least in a first flip iteration and with assistance of the soft data, a number of parity checks not satisfied by bits in the codeword to be decoded.

It should be noted that the memory controller provided by the example of the present disclosure includes the aforementioned decoder, and therefore, the terms and features of the decoder have been described in detail above, and will not be repeated here.

An example of the present disclosure further provides a memory system. The memory system may include a memory device configured to store data. The memory system may include a memory controller coupled to the memory device. The memory controller may include a processor and a decoder. The processor may be configured to read soft data corresponding to a codeword to be decoded from the memory device. The decoder may be configured to cache the soft data; and when performing hard-decision decoding on the codeword to be decoded, determine, at least in a first flip iteration and with assistance of the soft data, a number of parity checks not satisfied by bits in the codeword to be decoded.

In some examples, the processor may be further configured to read hard-read data from the memory device; and send the hard-read data to the decoder. The decoder may be further configured to receive the hard-read data and generate the codeword to be decoded according to the hard-read data.

In some examples, the decoder may include a cache module, a variable-node module, a check-node module, and a flip-indication module. The cache module may be configured to cache the soft data read by the processor. The variable-node module may be configured to receive the hard-read data read by the processor and generate the codeword to be decoded according to the hard-read data; and send the codeword to be decoded to a check-node module. The check-node module may be configured to receive the codeword to be decoded sent by the variable-node module; determine a checksum vector according to the codeword to be decoded and a pre-constructed check matrix; and send the checksum vector to a flip-indication module. The flip-indication module may be configured to receive the hard-read data and the codeword to be decoded sent by the variable-node module; receive the checksum vector sent by the check-node module; obtain the check matrix and the soft data; determine an initial error bit indication vector corresponding to the codeword to be decoded according to the hard-read data, the codeword to be decoded, the checksum vector, and the check matrix; and determine, with assistance of the soft data in combination with the initial error bit indication vector, a number of parity checks not satisfied by bits in the codeword to be decoded.

It should be noted that the memory system provided by the examples of the present disclosure includes the memory controller described above and the decoder included in the memory controller. Therefore, reference may be made to the above description for the terms and features appearing herein, which will not be repeated here.

The forgoing description is only a specific example of the present disclosure, but the protection scope of the present disclosure is not limited thereto. Anyone skilled in the art can easily conceive of changes or substitutions within the technical scope of the present disclosure, which should fall within the protection scope of the present disclosure.

What is claimed is:

1. A decoder, comprising:
a cache module configured to:
cache soft data related to a codeword to be decoded; and
a flip-indication module configured to:
obtain the soft data from the cache module, the soft data being expressed as a soft data vector; and
perform hard-decision decoding on the codeword to be decoded, wherein, to perform the hard-decision decode on the codeword to be decoded, the flip-indication module is configured to:
determine an initial error bit indication vector corresponding to the codeword to be decoded;
perform a sum operation on the soft data vector and the initial error bit indication vector to obtain a target error bit indication vector; and
determine, at least in a first flip iteration of one or more flip iterations and with assistance of the soft data, a number of parity checks not satisfied by each bit in the codeword to be decoded according to the target error bit indication vector,
wherein each element in the target error bit indication vector corresponds to the number of parity checks not satisfied by one bit.

2. The decoder of claim 1, further comprising:
a check-node module; and
a variable-node module configured to:
receive hard-read data and generate the codeword to be decoded according to the hard-read data;
send the codeword to be decoded to the check-node module; and
send the codeword to be decoded and the hard-read data to the flip-indication module,
wherein the variable-node module and the check-node module are connected to form a variable-check connection network according to a check matrix,
wherein the check-node module is configured to:
receive the codeword to be decoded;
determine a checksum vector according to the codeword to be decoded and the check matrix; and
send the checksum vector to the flip-indication module, and
wherein the flip-indication module is further configured to:
receive the codeword to be decoded and the hard-read data sent by the variable-node module;
receive the checksum vector sent by the check-node module;
obtain the check matrix and the soft data; and
determine the initial error bit indication vector corresponding to the codeword to be decoded according to the hard-read data, the codeword to be decoded, the checksum vector, and the check matrix.

3. The decoder of claim 2, wherein the flip-indication module is further configured to:
perform a sum operation on the hard-read data and the codeword to be decoded and then perform a modulo operation on the sum operation to obtain a first bit vector;
multiply transposition of the checksum vector by the check matrix to obtain a second bit vector; and
perform a sum operation on the first bit vector and the second bit vector to obtain the initial error bit indication vector.

4. The decoder of claim 2, wherein:
the flip-indication module is further configured to:
generate a flip-indication vector according to the number of parity checks not satisfied and a flipping criterion, wherein the flip-indication vector comprises determined bits that need to be flipped in the codeword to be decoded, and
the variable-node module is further configured to:

receive the flip-indication vector and flip the bits that need to be flipped in the codeword to be decoded according to the flip-indication vector.

5. The decoder of claim 4, wherein the flipping criterion comprises:
flipping the bits in the codeword to be decoded for which the number of parity checks not satisfied is largest, or
flipping the bits in the codeword to be decoded for which the number of parity checks not satisfied is greater than or equal to a preset threshold.

6. The decoder of claim 2, further comprising:
a counting module configured to:
counting a number of iterations of the hard-decision decoding performed on the codeword to be decoded; and
a termination-decision module configured to:
determine whether the number of iterations reaches a maximum number of iterations and determine whether the checksum vector is a zero vector; and
when the number of iterations reaches the maximum number of iterations and the checksum vector is a non-zero vector, output a first stop decoding signal, wherein the first stop decoding signal is configured to indicate that the hard-decision decoding of the codeword to be decoded fails.

7. The decoder of claim 6, further comprising:
a rearrangement module,
wherein the termination-decision module is further configured to:
when it is determined that the checksum vector is a zero vector, output a second stop decoding signal, and
wherein the rearrangement module is configured to:
in response to the second stop decoding signal, perform rearrangement processing on the codeword to be decoded; and
output codeword to be decoded in a correct order.

8. A method of decoding, comprising:
obtaining soft data corresponding to a codeword to be decoded, the soft data being expressed as a soft data vector; and
performing hard-decision decoding on the codeword to be decoded by:
determining an initial error bit indication vector corresponding to the codeword to be decoded;
performing a sum operation on the soft data vector and the initial error bit indication vector to obtain a target error bit indication vector; and
determining, at least in a first flip iteration of one or more flip iterations and with assistance of the soft data, a number of parity checks not satisfied by each bit in the codeword to be decoded according to the target error bit indication vector,
wherein each element in the target error bit indication vector corresponds to the number of parity checks not satisfied by one bit.

9. The method of claim 8, wherein the determining the initial error bit indication vector corresponding to the codeword to be decoded comprises:
receiving hard-read data and generating the codeword to be decoded according to the hard-read data;
determining a checksum vector according to the codeword to be decoded and a check matrix; and
determining the initial error bit indication vector corresponding to the codeword to be decoded according to the hard-read data, the codeword to be decoded, the checksum vector, and the check matrix.

10. The method of claim 9, wherein the determining the initial error bit indication vector corresponding to the codeword to be decoded according to the hard-read data, the codeword to be decoded, the checksum vector, and the check matrix comprises:
performing a sum operation on the hard-read data and the codeword to be decoded and then perform a modulo operation on the sum operation to obtain a first bit vector;
multiplying transposition of the checksum vector by the check matrix to obtain a second bit vector; and
performing a sum operation on the first bit vector and the second bit vector to obtain the initial error bit indication vector.

11. The method of claim 8, further comprising:
generating a flip-indication vector according to the number of parity checks not satisfied and a flipping criterion, wherein the flip-indication vector comprises determined bits that need to be flipped in the codeword to be decoded; and
flipping the bits that need to be flipped in the codeword to be decoded according to the flip-indication vector.

12. The method of claim 11, wherein the flipping criterion comprises:
flipping the bits in the codeword to be decoded for which the number of parity checks not satisfied is largest, or
flipping the bits in the codeword to be decoded for which the number of parity checks not satisfied is greater than or equal to a preset threshold.

13. The method of claim 9, further comprising:
counting a number of iterations of the hard-decision decoding performed on the codeword to be decoded;
determining whether the number of iterations reaches a maximum number of iterations and determining whether the checksum vector is a zero vector; and
when the number of iterations reaches the maximum number of iterations and the checksum vector is a non-zero vector, outputting a first stop decoding signal, wherein the first stop decoding signal indicates that the hard-decision decoding of the codeword to be decoded fails.

14. The method of claim 13, further comprising:
determining whether the checksum vector is a zero vector;
when it is determined that the checksum vector is a zero vector, outputting a second stop decoding signal;
in response to the second stop decoding signal, performing rearrangement processing on the codeword to be decoded; and
outputting codeword to be decoded in a correct order.

15. The method of claim 14, further comprising:
when the checksum vector is not a zero vector and the number of iterations has not reached the maximum number of iterations, output a continue-coding signal, wherein the continue-coding signal is associated with an instruction to perform a hard-decision decoding operation on the codeword to be decoded.

16. A memory system, comprising:
a memory device configured to store data;
a memory controller coupled to the memory device, wherein the memory controller comprises:
a processor configured to:
read soft data corresponding to a codeword to be decoded from the memory device, the soft data being expressed as a soft data vector; and
a decoder configured to:
cache the soft data; and perform hard-decision decoding on the codeword to be decoded, wherein, to perform the hard-decision decode on the codeword to be decoded, the decoder is configured to:

determine an initial error bit indication vector corresponding to the codeword to be decoded;

perform a sum operation on the soft data vector and the initial error bit indication vector to obtain a target error bit indication vector; and determine, at least in a first flip iteration of one or more flip iterations and with assistance of the soft data, a number of parity checks not satisfied by each bit in the codeword to be decoded according to the target error bit indication vector, wherein each element in the target error bit indication vector corresponds to the number of parity checks not satisfied by one bit.

* * * * *